United States Patent
Tomikawa et al.

(10) Patent No.: US 6,524,764 B1
(45) Date of Patent: Feb. 25, 2003

(54) POSITIVE-TYPE PHOTOSENSITIVE POLYIMIDE PRECURSOR COMPOSITION

(75) Inventors: Masao Tomikawa, Shiga (JP); Mitsuhito Suwa, Shiga (JP); Yoji Fujita, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/744,734

(22) PCT Filed: May 30, 2000

(86) PCT No.: PCT/JP00/03470

§ 371 (c)(1),
(2), (4) Date: Jan. 29, 2001

(87) PCT Pub. No.: WO00/73852

PCT Pub. Date: Dec. 7, 2000

(30) Foreign Application Priority Data

Jun. 1, 1999 (JP) ............................... 11-153722
Jun. 25, 1999 (JP) ............................... 11-179605
Oct. 4, 1999 (JP) ............................... 11-282466

(51) Int. Cl.⁷ ..................... G03F 7/023; G03F 7/30
(52) U.S. Cl. ................... 430/191; 430/165; 430/192; 430/193; 430/326; 430/330
(58) Field of Search ............... 430/191, 192, 430/193, 165, 326, 330

(56) References Cited

U.S. PATENT DOCUMENTS

| | | | | |
|---|---|---|---|---|
| 5,340,684 A | * | 8/1994 | Hayase et al. | 430/165 |
| 5,753,407 A | * | 5/1998 | Oba | 430/191 |
| 6,071,666 A | * | 6/2000 | Hirano et al. | 430/191 |
| 6,214,516 B1 | * | 4/2001 | Waterson et al. | 430/191 |

FOREIGN PATENT DOCUMENTS

| | | |
|---|---|---|
| EP | 0 769 485 | 4/1997 |
| JP | 10-186664 | 7/1998 |

* cited by examiner

Primary Examiner—John S. Chu
(74) Attorney, Agent, or Firm—Morrison & Foerster LLP

(57) ABSTRACT

The present invention relates to a positive type photosensitive resin precursor composition which is characterized in that it contains polymer having, as its chief component, structural units represented by the following general formula (1) and, furthermore, in that it satisfies the following conditions (a) and/or (b). The invention provides an alkali-developable photosensitive composition.

(a) There is included an ester of a naphthoquinone diazide sulphonic acid and a phenol compound of dipole moment 0.1 to 1.6 debye (b) There is included a phenol compound represented by general formula (8) and a naphthoquinone diazide sulphonic acid and/or an ester of a phenol compound represented by general formula (8) and a naphthoquinone diazide sulphonic acid

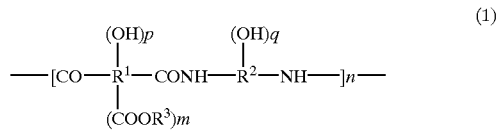

(1)

(In general formula (1), $R^1$ represents a bivalent to octavalent organic group with at least two carbon atoms, $R^2$ represents a bivalent to hexavalent organic group with at least two carbon atoms, and $R^3$ represents hydrogen or an organic group with from one to ten carbons. n is an integer in the range 10 to 100,000, m is an integer in the range 0 to 2, and p and q are integers in the range 0 to 4, but p and q are not simultaneously 0.)

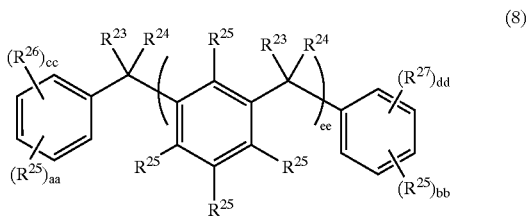

(8)

(In the formula, $R^{23}$, $R^{24}$, $R^{26}$ and $R^{27}$ each represents a hydrogen atom or a $C_{1-8}$ alkyl group, alkoxy group, carboxyl group or ester group. At least one $R^{25}$ is hydroxyl group, while the rest represent hydrogen atoms and $C_{1-8}$ alkyl groups. aa, bb, cc and dd represent integers in the range 0 to 3. However, aa+bb≦5, bb+dd≦5 and aa+bb>0. ee represents an integer in the range 1 to 3.)

12 Claims, No Drawings

POSITIVE-TYPE PHOTOSENSITIVE POLYIMIDE PRECURSOR COMPOSITION

TECHNICAL FIELD

The present invention relates to a positive type photosensitive polyimide precursor composition where regions exposed using ultraviolet radiation dissolve in aqueous alkali solution and which is suitable for semiconductor element surface protective films, layer insulation films and the like. That is to say, it relates to a positive type photosensitive polyimide precursor composition suitable for semiconductor element surface protective films, layer insulation films and the like, where regions exposed using ultraviolet radiation dissolve in aqueous alkali solution.

TECHNICAL BACKGROUND

As examples of positive type heat-resistant resin precursor compositions where the exposed regions are dissolved by developing, there are known those where a naphthoquinone diazide is added to a polyamic acid (JP-A-52-13315), those where a naphthoquinone diazide is added to a soluble polyimide which possesses hydroxyl groups (JP-A-64-60630) and those where a naphthoquinone diazide is added to a polyamide which possesses hydroxyl groups (JP-A-56-27140).

However, where a naphthoquinone diazide is added to an ordinary polyamic acid there is the problem that, since the solubility of the polyamic acid carboxyl groups is higher than the inhibitory effect of the naphthoquinone diazide in terms of alkali solubility, in most cases the desired pattern cannot be obtained. Furthermore, where a hydroxyl group-containing soluble polyimide resin is added, although there is little such aforesaid problem, there is the difficulty that, in order to provide solubility, the structures are limited and the solvent resistance of the polyimide resin obtained is poor.

Taking into account the aforesaid shortcomings, in the present invention it has been discovered that by adding a novel naphthoquinone diazide compound of specified structure to a polyimide precursor, the resin composition obtained essentially does not dissolve at all in alkali developer prior to exposure but, once exposed, it readily dissolves in the alkali developer, so there is little film loss due to the developing and developing is possible in a short time. It is on this discovery that the present invention is based.

That is to say, in accordance with the present invention, by adding a specified naphthoquinone diazide compound to a polyimide precursor of specified structure, there can be provided a positive type heat-resistant resin composition which shows little film loss in the unexposed regions due to developing and, furthermore, which can be developed in a short time.

DISCLOSURE OF THE INVENTION

The present invention relates to a positive type photosensitive resin precursor composition which is characterized in that it contains polymer having, as its chief component, structural units represented by the following general formula (1) and, furthermore, in that it satisfies the following conditions (a) and/or (b).

(a) There is included an ester of a naphthoquinone diazide sulphonic acid and a phenol compound of dipole moment 0.1 to 1.6 debye (b) There is included a phenol compound represented by general formula (8) and a naphthoquinone diazide sulphonic acid and/or an ester of a phenol compound represented by general formula (8) and a naphthoquinone diazide sulphonic acid

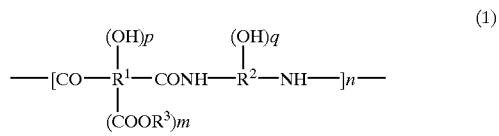

(In general formula (1), $R^1$ represents a bivalent to octavalent organic group with at least two carbon atoms, $R^2$ represents a bivalent to hexavalent organic group with at least two carbon atoms, and $R^3$ represents hydrogen or an organic group with from one to ten carbons. n is an integer in the range 10 to 100,000, m is an integer in the range 0 to 2, and p and q are integers in the range 0 to 4. However, p and q are not simultaneously 0.)

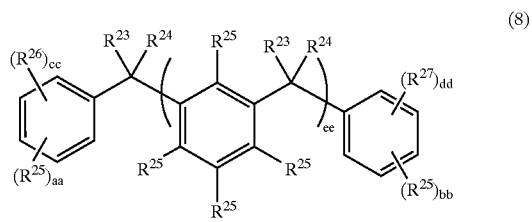

(In the formula, $R^{10}$, $R^{11}$, $R^{13}$ and $R^{14}$ each represents a hydrogen atom or a $C_{1-8}$ alkyl group, alkoxy group, carboxyl group or ester group. $R^{12}$ represents a hydroxyl group, hydrogen atom or $C_{1-8}$ alkyl group. $\alpha$, $\beta_o$ and $\delta$ represent integers in the range 0 to 3. However, $\alpha+\beta \leq 5$, $\beta+\delta \leq 5$ and $\alpha+\beta>0$. x represents an integer in the range 1 to 3.)

Optimum Form for Practising the Invention

In the present invention, the polymer having, as its chief component, structural units represented by general formula (1) is a polymer from which there can be formed, by heating or by means of a suitable catalyst, polymer having imide rings, oxazole rings or other cyclic structures. By forming cyclic structures, the heat resistance and solvent resistance are markedly raised.

Aforesaid general formula (1) represents a hydroxyl group-containing polyamic acid or a polyhydroxyamide and, due to the presence of the hydroxyl groups, the solubility in aqueous alkali solution is better than that of a polyamic acid which does not possess hydroxyl groups. In particular, phenolic hydroxyl groups are the preferred hydroxyl groups in terms of the solubility in aqueous alkali solution. Moreover, by having at least 10 wt % of fluorine atoms in general formula (1), a suitable degree of water repellency is shown at the film interface at the time of the developing with aqueous alkali solution, so permeation at the interface, etc, is suppressed. However, if the fluorine atom content exceeds 20 wt %, the solubility in the aqueous alkali solution is lowered, the organic solvent resistance of the polymer which has been provided with cyclic structures by heat treatment is reduced, and the solubility in fuming nitric acid declines, so this is undesirable. Thus, a fluorine atom content of 10 wt % to 20 wt % is preferred.

In the case where m is 0, hydroxyphthalic acid, bis(hydroxycarboxyphenyl)hexafluoropropane or oxydi(hydroxycarboxybenzene), etc, may be used.

In aforesaid general formula (1), $R^1(OH)_p(COOR^3)_m$ denotes the acid structural component and it is preferred that this group be a bivalent to octavalent group with at least two carbons, which contains an aromatic ring and possesses from 1 to 4 hydroxyl groups.

Specifically, a group having a structure as represented by general formula (2) is preferred. In this case, $R^4$ and $R^6$ represent $C_{2-20}$ trivalent or tetravalent organic groups. In particular, groups containing an aromatic ring are preferred in terms of the heat resistance of the polymer obtained, with particularly preferred examples thereof being the trimellitic acid residue, the trimesic acid residue and the naphthalene tricarboxylic acid residue.

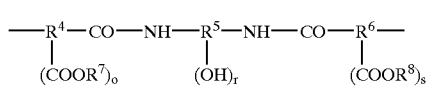

(2)

$R^5$ is preferably a hydroxyl group-containing $C_{3-20}$ trivalent to hexavalent organic group. In addition, it is preferred that the hydroxyl groups be positioned adjacent to an amide bond. Examples thereof are groups with bonded amino groups such as the bis(3-amino-4-hydroxyphenyl) hexafluoropropane residue and the bis(3-hydroxy-4-aminophenyl)hexafluoropropane residue, which contain fluorine atoms, and the bis(3-amino-4-hydroxyphenyl) propane residue, the bis(3-hydroxy-4-aminophenyl)propane residue, the 3,3'-diamino-4,4'-dihydroxybiphenyl residue, the 3,3'-diamino-4,4'-dihydroxybiphenyl residue, the 2,4-diaminophenol residue, the 2,5-diaminophenol residue and the 1,4-diamino-2,5-dihydroxybenzene residue, which do not contain fluorine atoms.

$R^7$ and $R^8$ in general formula (2) may each be hydrogen or a $C_{1-10}$ organic group. If there are more than 10 carbons, the solubility in the alkali developer is lowered. $R^7$ and $R^8$ may be the same or different. o and s denote 1 or 2, and r denotes an integer in the range 1 to 4. If r is 5 or more, then the properties of the heat-resistant film obtained decline and the water absorption becomes considerable.

Amongst the compounds of general formula (2), those of structure as shown below may be given as preferred examples, but there is no restriction thereto.

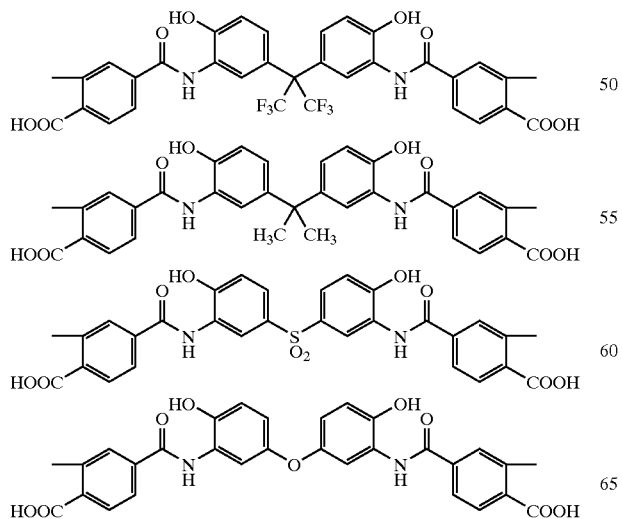

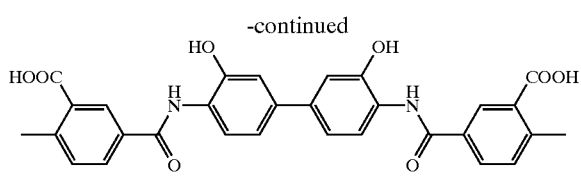

In the case where q in the $R^2(OH)_q$ moiety of general formula (1) is 1 or more, there can employed a dicarboxylic acid residue, tetracarboxylic acid residue or tricarboxylic acid residue which does not contain hydroxyl groups. As examples thereof, there are the isophthalic acid residue, terephthalic acid residue, dicarboxydiphenyl ether residue, dicarboxydiphenyl sulphone residue, bis(carboxyphenyl) hexafluoropropane residue, naphthalenedicarboxylic acid residue, pyromellitic acid residue, benzophenonetetracarboxylic acid residue, bisphenyltetracarboxylic acid residue, diphenyl ether tetracarboxylic acid residue, diphenyl sulphone tetracarboxylic acid residue and other such aromatic tetracarboxylic acid residues, or the diester compounds where two of these carboxyl groups are given methyl or ethyl groups, the butanetetracarboxylic acid residue, dicyclopentanetetracarboxylic acid residue or other such aliphatic tetracarboxylic acid residues, or the diester compounds thereof where two of these carboxyl groups are given methyl or ethyl groups, the trimellitic acid residue, the trimesic acid residue and other such aromatic tricarboxylic acid residues, and the like.

$R^2(OH)_q$ in general formula (1) denotes the diamine structural component. With regard to preferred examples thereof, it is desirable in terms of the heat resistance of the polymer obtained that $R^2(OH)_q$ contains aromaticity and it is also desirable that it possesses hydroxyl groups. Specific examples are the bis(amino-hydroxy-phenyl) hexafluoropropane residue, which contains fluorine atoms, and the diaminodihydroxypyrimidine residue, diaminodihydroxypyridine residue, hydroxy-diamino-pyrimidine residue, diaminophenol residue and dihydroxybenzidine residue, which do not contain fluorine atoms, and also those of structure represented by general formulae (3), (4) and (5).

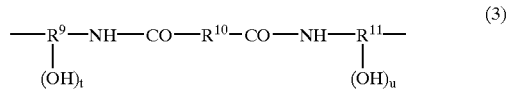

(3)

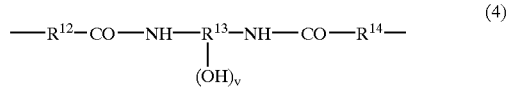

(4)

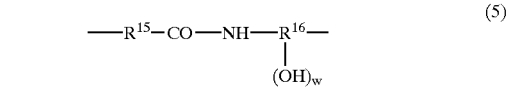

(5)

In general formula (3), $R^9$ and $R^{11}$ represent $C_{2-20}$ trivalent or tetravalent organic groups which contain hydroxyl groups, and from the point of view of the heat resistance of the polymer obtained it is preferred that they contain an aromatic ring. Specific examples are the groups represented by the following formulae.

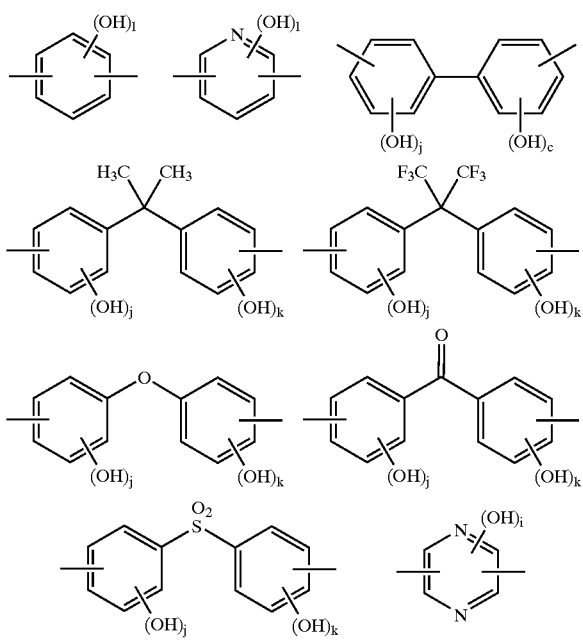

i represents an integer in the range 1 to 4, j and k represent integers in the range 0 to 4, and j+k is at least 1. Furthermore, there can be used aliphatic groups such as the hydroxycyclohexyl group or dihydroxycyclohexyl group.

$R^{10}$ in general formula (3) represents a $C_{2-30}$ bivalent organic group. From the point of view of the heat resistance of the polymer obtained, it should be a bivalent group possessing aromaticity, examples of which are the following.

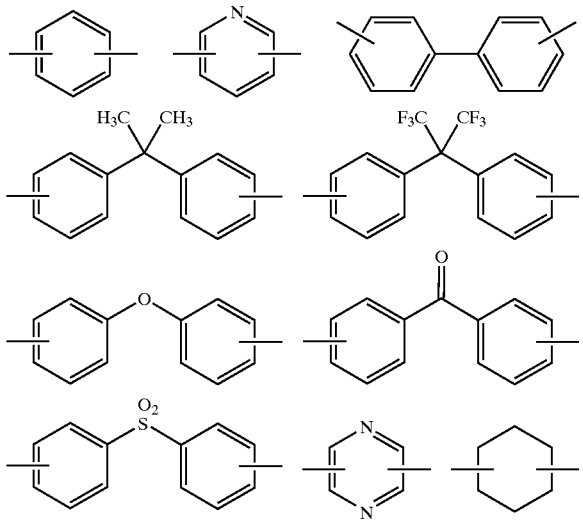

In general formula (4), $R^{12}$ and $R^{14}$ represent $C_{2-30}$ bivalent organic groups. In terms of the heat resistance of the polymer obtained, they should be bivalent groups with aromaticity, as examples of which there can be cited the same groups as provided above as specific examples of $R^{11}$ in general formula (3). $R^{13}$ represents a hydroxyl group-containing $C_{2-20}$ trivalent to hexavalent organic group, and in terms of the heat resistance of the polymer obtained it is preferred that it be a group with an aromatic ring. As examples of such groups, there can be cited the same groups as provided above as specific examples of $R^9$ and $R^{11}$ in general formula (3).

In general formula (5), $R^{15}$ represents a $C_{2-20}$ bivalent organic group. In terms of the heat resistance of the polymer obtained, it should be a bivalent group which possesses aromaticity, as examples of which there can be cited the same groups as provided above as specific examples of $R^{10}$ in general formula (3). $R^{16}$ in general formula (5) represents a hydroxyl group-containing $C_{2-20}$ trivalent to hexavalent organic group and, in terms of the heat resistance of the polymer obtained, a group with an aromatic ring is preferred. As examples of such groups, there can be cited the same groups as provided above as specific examples of $R^9$ and $R^{11}$ in general formula (3). Specific examples of the groups represented by general formula (3) are the following.

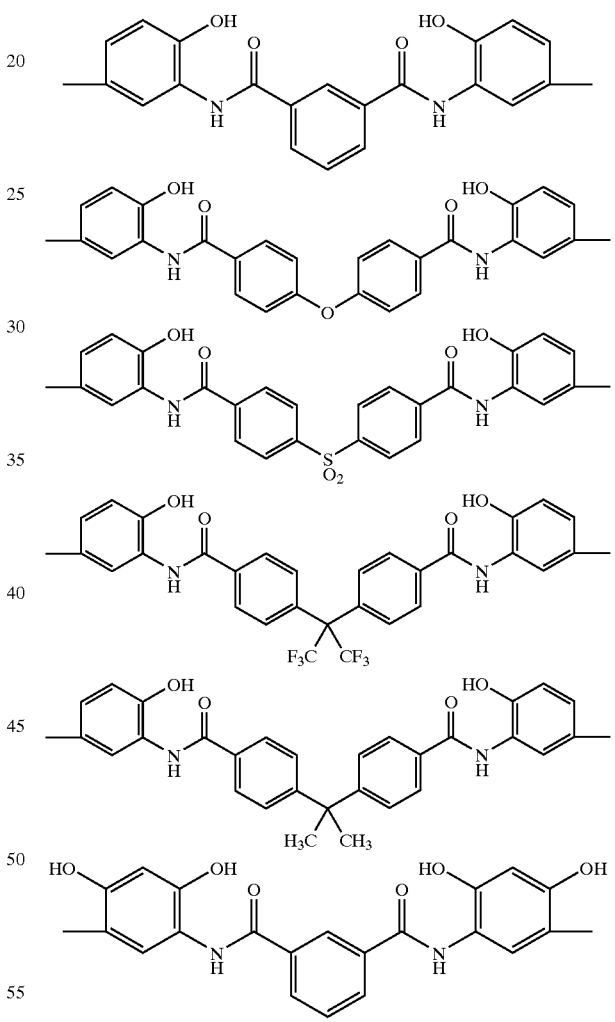

Specific examples of the groups represented by general formula (4) are the following.

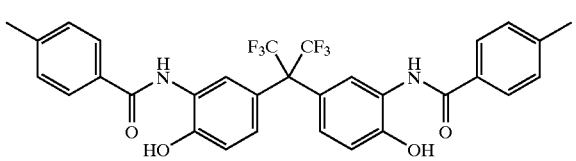

-continued
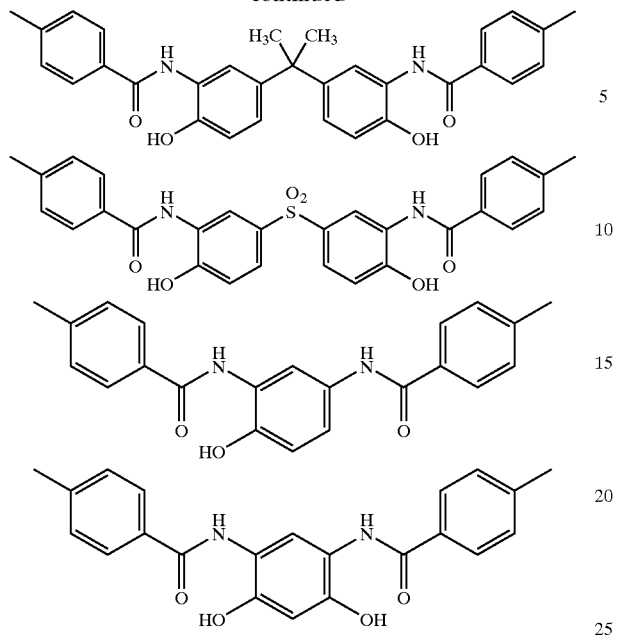
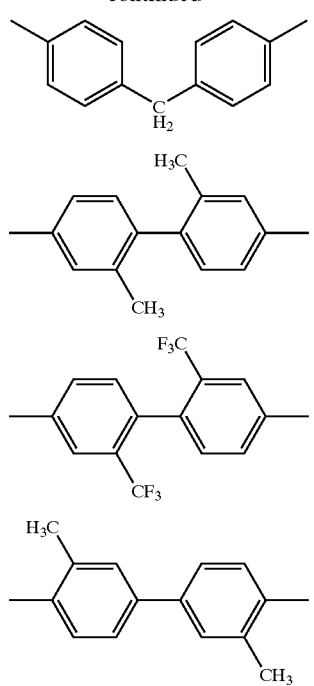
Specific examples of the groups represented by general formula (5) are the following.
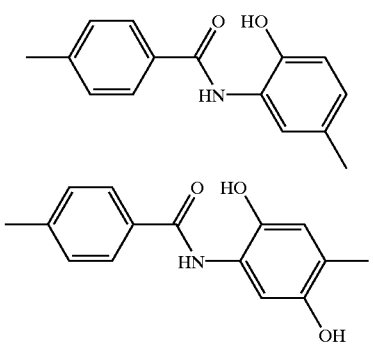
Furthermore, when p in $R^1(OH)_p(COOR^3)_m$ of general formula (1) is from 1 to 4, it is possible to use a diamine component which does not have hydroxyl groups. Examples in such circumstances are the following.
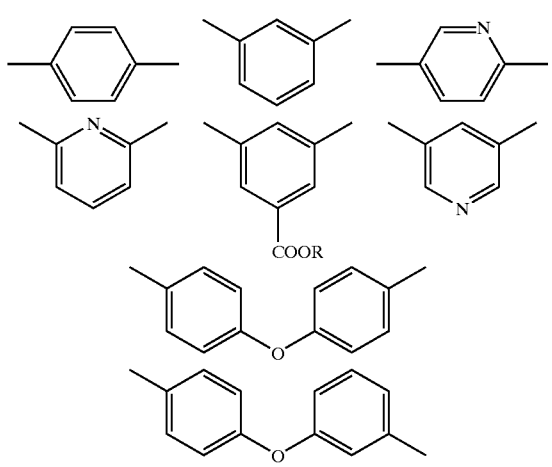

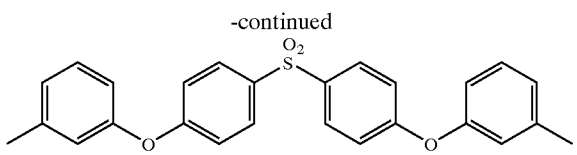

R³ in general formula (1) represents hydrogen or an organic group with from 1 to 10 carbons. From the point of view of the stability of the photosensitive resin precursor solution obtained, R³ is preferably an organic group, but in terms of the solubility in aqueous alkali solution hydrogen is preferred. In the present invention it is possible to use a mixture of a hydrogen atom and alkyl group. By controlling the amount of hydrogen and organic group employed as R³, the solubility rate in the aqueous alkali solution can be made to vary, so by adjustment thereof it is possible to obtain a photosensitive resin precursor solution having a suitable rate of dissolution. R³ may be all hydrogen or it may be all organic group, but it is preferred that R³ be from 10% to 90% hydrogen. If the number of carbons in R³ exceeds 10, the aqueous alkali solubility is lost.

Furthermore, in order to enhance the adhesion to the substrate, there may be copolymerized aliphatic groups with a siloxane structure as $R^1(OH)_p(COOR^3)_m$ or as $R^2(OH)_q$ in general formula (1), within a range that does not lower the heat resistance. Specifically, there can be copolymerized from 1 to 20 mol % of the following as $R^1(OH)_p(COOR^3)_m$.

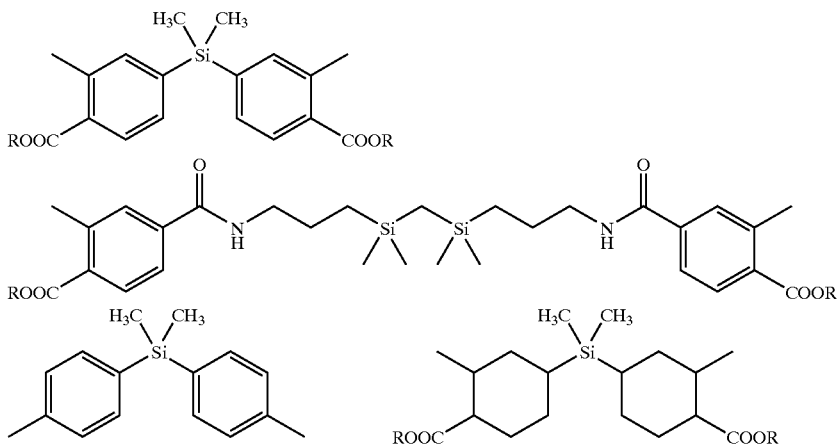

(R represents a hydrogen atom or a $C_{1-10}$ monovalent organic group.)

In the case of the $R^2(OH)_q$ moiety in general formula (1), there can be copolymerized from 1 to 20 mol % of the bis(3-aminopropyl)tetramethyldisiloxane residue, the bis(4-aminophenyl)octamethylpentasiloxane residue, the α,ω-bis(3-aminopropyl)permethylpolysiloxane residue or the like.

The polymer of the present invention may comprise only structural units represented by general formula (1) or it may also be a copolymer or a blend with other structural units. In such circumstances, it is preferred that there be present at least 90 mol % of the structural units represented by general formula (1). The type and the amount of other structural units incorporated by copolymerisation or by blending will preferably be selected such that there is no impairment of the heat resistance of the polyimide polymer obtained by the final heat treatment.

As examples of the synthesis of the photosensitive resin precursor composition of the present invention, there can be employed the method of reacting a tetracarboxylic acid dianhydride and a diamine compound at low temperature (C. E. Sroog et al, Journal Polymer Science, Part A-3, 1373 (1965)), the method in which a diester is obtained between a tetracarboxylic acid dianhydride and an alcohol, after which reaction is performed with an amine in the presence of a condensing agent (JP-A-61-72022) and the method in which a diester is obtained between a tetracarboxylic acid dianhydride and an alcohol, after which the remaining dicarboxylic acid is converted to the acid chloride form and then reaction performed with an amine (JP-A-55-30207).

In the present invention, the naphthoquinone diazide compound added is a compound obtained by the reaction of naphthoquinone diazide sulphonic acid with a phenol compound of dipole moment 0.1 to 1.6. In the present invention, the dipole moment of the phenol compound can be determined by molecular orbital calculation. Using a Dell notebook type personal computer, model Latitude CP, provided with 64 MB of memory, the molecular structure was input with the Cambridge Co. molecular modelling software "Chem3D" and, after stabilizing the structure by means of a molecular strength of field calculation based on the MM2 parameter accompanying said software, the optimum structure was calculated by the parameter AM-1 method using MOPAC-97 accompanying said software. The dipole moment at this time was employed.

By using a phenol compound of small such dipole moment, the hydrophobic character of the naphthoquinone diazide sulphonic acid ester obtained is raised. Hence, the unexposed regions hardly dissolve at all in aqueous alkali solution. Moreover, in the exposed regions, since an indene carboxylic acid residue is produced by the photodecomposition of the naphthoquinone diazide group, the solubility in aqueous alkali solution is raised. Hence, it is possible to obtain an excellent pattern with little film loss in the unexposed regions due to development.

If the dipole moment is greater than 1.6 debye, then there is little protective effect in the unexposed regions, while if it is less than 0.1 debye the naphthoquinone diazide sulphonic acid ester formed from said compound is no longer highly compatible with the polymer of general formula (1), so it is no longer possible to obtain an excellent image. For such reasons, the dipole moment preferably lies in the range 0.1 to 1.6 debye, more preferably 0.15 to 1.3 debye and still more preferably in the range 0.2 to 1 debye.

Again, it is better if the phenol compound of dipole moment from 0.1 to 1.6 debye has at least two benzene rings. Where there is one benzene ring, the effect in terms of suppressing the solubility in aqueous alkali is small, so there is a fear that the specified performance will not be realized. On the other hand, however, if there are 10 or more benzene rings, problems arise such as the compatibility with the polymer being poor, there being incomplete decomposition in the heat treatment after the pattern is obtained, and the properties of the film being impaired. Hence, the preferred phenol compound in the present invention will have a form in which there are from 1 to 10 benzene rings, and more preferably from 3 to 6 benzene rings. As the photosensitive agents represented by general formulae (6) and (7) in the present invention, there may be employed compounds with one type of structure or there may be used a mixture of a number of compounds of different structures. In the case where a plurality of such compounds is used, it is preferred that the average dipole moment of the phenol compound in the photosensitive agent used be no more than 1.5 debye.

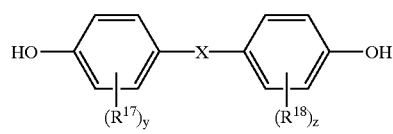

(6)

(X represents an oxygen atom or sulphur atom. $R^4$ and $R^5$ each represent a hydrogen atom or a $C_{1-10}$ monovalent organic group, and they may both be the same or different. r and s represent integers in the range 0 to 4.)

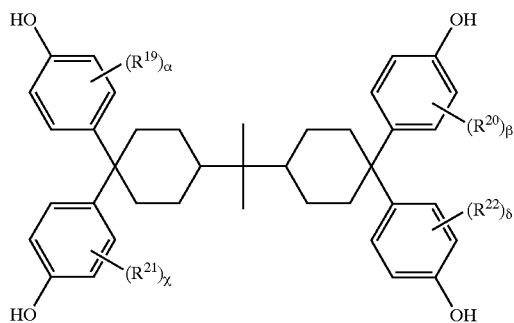

(7)

In general formula (6), $R^{17}$ and $R^{18}$ each represent a hydrogen atom or a $C_{1-10}$ monovalent organic group. Using a group with no more than 2 carbons is preferred in terms of the excellence of the film heat resistance after heat treatment. From this point of view, using hydrogen atoms is further preferred. y and z denote integers in the range 0 to 4. From the point of view of the coloration following heat treatment, a value of 2 or below is preferred. X represent an oxygen atom or sulphur atom but oxygen is preferred in terms of the atom dipole moment being small and the heat resistance being good.

For $R^{19}$, $R^{20}$, $R^{21}$ and $R^{22}$ in general formula (7), there can be used the same groups as for $R^{17}$ and $R^{18}$ in general formula (6) above. α, β, χ and δ are the same as y and z in general formula (6).

By adding a compound of such structure, it is possible to markedly lower the film loss from the unexposed regions due to development and it is possible to obtain an excellent pattern in a short development time. In one of the quinone diazide compounds represented by general formula (7), when the hydrogen atoms denoted by Q are increased, there is an increase in the solubility, in alkali developer, of the photosensitive agent represented by general formula (7), so the effect in terms of protecting the polymer represented by general formula (1) is reduced. From this point of view, the proportion comprising hydrogen atoms is preferably no more than ⅓ and more preferably no more than ⅕. Again, as examples of the groups in cases where these are other than hydrogen atoms, there are the 4-naphthoquinone diazide sulphonyl group or the 5-naphthoquinone diazide sulphonyl group shown below.

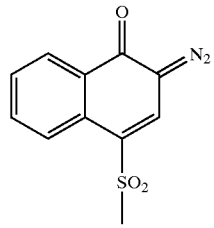

4-naphthoquinone diazide sulphonyl group

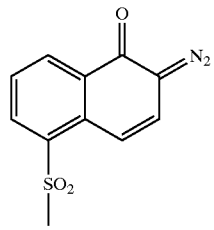

5-naphthoquinone diazide sulphonyl group

The 4-naphthoquinone diazide sulphonyl group absorbs in the i-line region of a mercury lamp and is suitable for i-line exposure, while with the 5-naphthoquinone diazide sulphonyl group absorption extends to the g-line region of a mercury lamp and it is suitable for g-line exposure. In the present invention, there can be favourably used both the 4-naphthoquinone diazide sulphonyl group and the 5-naphthoquinone diazide sulphonyl group, and it is preferred that selection between the 4-naphthoquinone diazide sulphonyl group and the 5-naphthoquinone diazide sulphonyl group be made depending on the exposure wavelength. Again, it is also possible to jointly introduce both the 4-naphthoquinone diazide sulphonyl group and the 5-naphthoquinone diazide sulphonyl group into the same molecule, or there can be used a mixture of a photosensitive agent in which the 4-naphthoquinone diazide sulphonyl group has been introduced as a photosensitive group and a photosensitive agent in which the 5-naphthoquinone diazide sulphonyl group has been introduced as a photosensitive group.

As examples of the compounds with a phenolic hydroxyl group represented by general formula (8) in the present invention, there are BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X and BisRS-OCHP (the above are commercial names of products manufactured by the Honshu Chemical Industry Co.), and BIR-OC, BIP-PC, BIR-PC, BIR-PTBP, BIR-PCHP, BIP-BIOC-F, 4PC, BIR-BIPC-F and TEP-BIP-A (the above are commercial names of products manufactured by the Asahi Organic Chemicals Industry Co.).

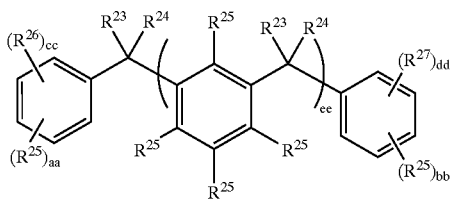

(8)

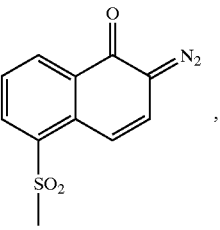 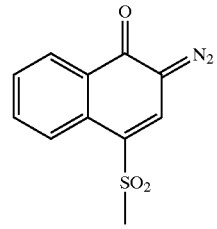

-continued $$Q =$$

(In the formula, $R^{27}$, $R^{28}$, $R^{30}$ and $R^{31}$ each represent a hydrogen atom, or a $C_{1-8}$ alkyl group, alkoxy group, carboxyl group or ester group. At least one $R^{29}$ denotes —OQ (the naphthoquinone diazide sulphonyl group), while the rest represent hydroxyl groups, hydrogen atoms or $C_{1-8}$ alkyl groups. a and b represent integers in the range 0 to 3, and Q represents the 5-naphthoquinone diazide sulphonyl group or the 4-naphthoquinone diazide sulphonyl group)

$R^{23}$ and $R^{24}$ preferably represent a methyl group or hydrogen atom. It is preferred that at least one $R^{25}$ be a hydroxyl group, while otherwise $R^{25}$ represents a hydrogen atom, methyl group, tert-butyl group, cyclohexyl group or hydroxybenzyl group. Furthermore, $R^{26}$ and $R^{27}$ preferably represent a hydroxyl group, hydrogen atom or cyclohexyl group. It is undesirable that $R^{23}$, $R^{24}$, $R^{25}$ and $R^{26}$ be groups other than as described above, in that instead of an alkali solubility promoting effect, they will have a considerable effect in impeding dissolution. Further preferred examples of the compound with a phenolic hydroxyl group are BisRS-2P, BisRS-3P, BisP-OCHP, methylenetris-FR-CR, BisRS-26X, BIP-PC, BIR-PC and BIR-BIPC-F. By adding such a compound which possesses a phenolic hydroxyl group, the resin composition obtained essentially does not dissolve in the alkali developer before exposure, but following exposure it readily dissolves in alkali, so there is little film loss by the development and developing is easy in a short time.

The amount of such compound with a phenolic hydroxyl group added is preferably from 1 to 50 parts by weight, and more preferably 3 to 40 parts by weight, per 100 parts by weight of the polymer.

The naphthoquinone diazide compound added in the present invention is preferably a compound in which a naphthoquinone diazide sulphonic acid is coupled to the compound with a phenolic hydroxyl group by esterification. The compound with a phenolic hydroxyl group employed for this purpose may be the same as the compound with a phenolic hydroxyl group represented. by general formula (8) employed in the present invention, or it may be different. As examples of such compounds which are not represented by general formula. (8), there are compounds like naphthol, tetrahydroxybenzophenone, methyl gallate, bisphenol A, methylenebisphenol, TrisP-HAP (commercial name, made by the Honshu Chemical Industry Co.), BisP-AP (commercial name, made by the Honshu Chemical Industry Co.), with preferred examples of the aforesaid naphthoquinone diazide compound being formed by esterification of these with 4-naphthoquinone diazide sulphonic acid or 5-naphthoquinone diazide sulphonic acid. However, other compounds can also be used.

Furthermore, the naphthoquinone diazide compounds conforming to general formula (9) are also preferred in the present invention.

For example, there are the 5-naphthoquinone diazide sulphonyl ester compounds or the 4-naphthoquinone diazide sulphonyl ester compounds of compounds with a phenolic hydroxyl group such as BisRS-2P, BisPG-26X, BisOC-OCHP, BisP-OCHP, BisPC-OCHP, Bis25X-OCHP, Bis26X-OCHP, BisOCHP-OC, Bis236T-OCHP, methylenetris-FR-CR, BisRS-26X and BisRS-OCHP (the above are commercial names of products manufactured by the Honshu Chemical Industry Co.), and BIR-OC, BIP-PC, BIR-PC, BIR-PTBP, BIR-PCHP, BIP-BIOC-F, 4PC, and BIR-BIPC-F (the above are commercial names of products manufactured by the Asahi Organic Chemicals Industry Co.). Amongst these, $R^{27}$ and $R^{28}$ are preferably a methyl group or hydrogen atom. At least one $R^{29}$ preferably denotes —OQ (the naphthoquinone diazide sulphonyl group), while the rest represent hydroxyl groups, hydrogen atoms, methyl groups, tert-butyl groups or cyclohexyl groups. Again, $R^{30}$ and $R^{31}$ are preferably a hydroxyl group, hydrogen atom or cyclohexyl group. In the case where $R^{27}$, $R^{28}$, $R^{30}$ and $R^{31}$ are respectively other than as described above, following exposure of the naphthoquinone diazide compound, when dissolving in the alkali developer, there is a considerable dissolution inhibition effect by the substituent groups, so there is a lowering of the sensitivity, which is undesirable. As further preferred examples of the 5-naphthoquinone diazide sulphonyl ester compounds or the 4-naphthoquinone diazide sulphonyl ester compounds of the compounds with a phenolic hydroxyl group, there are the 5-naphthoquinone diazide sulphonyl esters and the 4-naphthoquinone diazide sulphonyl esters of BisRS-2P, BisP-OCHP, BisRS-OCHP, methylenetris-FR-CR, BisOCHP-OC, BIP-PC, BIR-PC and BIR-BIPC-F.

The 4-naphthoquinone diazide sulphonyl esters exhibit absorption in the i-line region of a mercury lamp and are suitable for i-line exposure, while with the 5-naphthoquinone diazide sulphonyl esters absorption extends to the g-line region of a mercury lamp and they are suitable for g-line exposure. In the present invention, there can be favourably used both the 4-naphthoquinone diazide sulphonyl group and the 5-naphthoquinone diazide sulphonyl group, and it is preferred that selection be made between the 4-naphthoquinone diazide sulphonyl group and the 5-naphthoquinone diazide sulphonyl group depending on the exposure wavelength. Again, it is also possible to obtain a naphthoquinone diazide sulphonyl ester compound jointly using the 4-naphthoquinone diazide sulphonyl group and the 5-naphthoquinone diazide sulphonyl group in the same molecule, or there can be used a mixture of the (9)

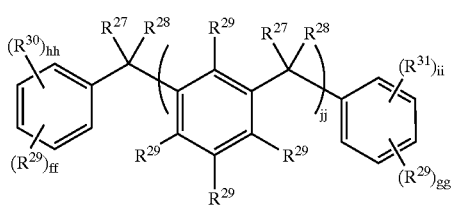

4-naphthoquinone diazide sulphonyl ester compound and the 5-naphthoquinone diazide sulphonyl ester compound.

The naphthoquinone diazide compound of the present invention can be synthesized by an esterification reaction between the phenolic hydroxyl group-containing compound and the quinone diazide sulphonic acid compound. Known methods of synthesis can be used for this purpose.

The amount of naphthoquinone diazide compound added is preferably from 1 to 50 parts by weight and preferably 3 to 40 parts by weight per 100 parts by weight of polymer.

Again, where required, with the objective of enhancing the application characteristics between the photosensitive resin precursor composition and the substrate, there may be incorporated surfactants, esters such as ethyl lactate and propylene glycol monomethyl ether acetate, alcohols such as ethanol, ketones such as cyclohexanone and methyl isobutyl ketone, and ethers such as tetrahydrofuran and dioxane. Again, there can also be added inorganic particles such as silicon dioxide and titanium dioxide, or powders such as polyimides.

Furthermore, for the purposes of enhancing the adhesion to the silicon wafer or other underlying substrate, there may be added from 0.5 to 10 wt % of silane coupling agent, titanium chelate agent or the like to the photosensitive resin precursor composition varnish, or the underlying substrate can be treated with a chemical of this kind.

Where added to the varnish, there is added the silane coupling agent such as methyl methacryloxy-dimethoxysilane, 3-aminopropyltrimethoxysilane or (vinyltrimethoxysilane), or the titanium chelate agent or aluminium chelate agent, in an amount lying in the range from 0.5 to 10 wt % in terms of the polymer in the varnish.

In the case where the substrate is treated, surface treatment is carried out using a solution in which there is dissolved from 0.5 to 20 wt % of the aforesaid coupling agent in a solvent such as isopropanol, ethanol, methanol, water, tetrahydrofuran, propylene glycol monomethyl ether acetate, propylene glycol monomethyl ether, ethyl lactate or diethyl adipate, by means of spin coating, immersion, spraying or vapour treatment, etc. Depending of the circumstances, reaction between the substrate and the aforesaid coupling agent is promoted by subsequent heating at a temperature of from 50° C. to 300° C.

Next, the method of forming a heat-resistant resin pattern using the photosensitive resin precursor composition of the present invention is explained.

The photosensitive resin precursor composition is applied to the substrate. Examples of the substrate employed are silicon wafers, ceramics, gallium arsenide and the like, but there is no restriction thereto. As examples of the application method, there are methods such as rotary coating using a spinner, spray application, roll coating and the like. Again, while the coating thickness will vary with the application method, the solids concentration of the composition and its viscosity, etc, normally application is performed such that the film thickness after drying is from 0.1 to 150 $\mu$m.

Next, the substrate on which the photosensitive resin precursor composition has been applied is dried, and a photosensitive resin precursor composition coating obtained. The drying is carried out in the range 50° to 150° for from 1 minute to several hours, using an oven, a hot plate, infrared radiation or the like.

Next, this photosensitive resin precursor composition coating is exposed to actinic radiation through a mask which has the desired pattern. As examples of the actinic radiation used for the exposure, there are ultraviolet radiation, visible light, an electron beam, X rays and the like but, in the present invention, the use of the mercury lamp i-line (365 nm), h-line (405 nm) or g-line (436 nm) is preferred.

To form the heat-resistant resin pattern, following exposure the exposed regions are eliminated, using a developer. Preferred examples of the developer are aqueous tetramethylammonium solutions, and aqueous solutions of compounds which exhibit alkalinity such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylene diamine and the like. Again, depending on the circumstances, there may be added, to these aqueous alkali solutions, a solvent such as a polar solvent like N-methyl-2-pyrrolidone, N,N-dimethylformamide, N,N-dimethylacetamide, dimethylsulphoxide, $\gamma$-butyrolactone or dimethylacrylamide, an alcohol such as methanol, ethanol or isopropanol, an ester such as ethyl lactate or propylene glycol monomethyl ether acetate, or a ketone such as cyclopentanone, cyclohexanone, isobutyl ketone or methyl isobutyl ketone, or a combination of such solvents. Following the developing, a rinsing treatment is carried out with water. Here too, the treatment may be carried out with the addition, to the water, of an alcohol such as ethanol or isopropyl alcohol, an ester such as ethyl lactate or propylene glycol monomethyl ether acetate, or the like.

After the development, there is applied a temperature in the range 200–500°, to effect conversion to the heat-resistant resin coating. This heat treatment is carried out for from 5 minutes to 5 hours, either by selection of temperatures and raising the temperature in stages, or by selecting a temperature range and raising the temperature continuously. As an example, the heat treatment is carried out for periods of 30 minutes at 130° C., 200° C. and 350° C. Alternatively, there is the method of raising the temperature linearly over 2 hours from room temperature to 400° C.

The heat-resistant resin coating formed from the photosensitive resin precursor composition of the present invention is used in applications such as semiconductor passivation films, semiconductor element protective films and the layer insulation for multilayer circuits for high density mounting.

EXAMPLES

Below, in order to explain the invention in more detail, explanation is provided by means of examples but the invention is not to be restricted thereto.
Method of Measuring Properties
Measurement of Film Thickness Using a Lamda Ace STM-602 produced by the Dainippon Screen Manufacturing Co., measurement was carried out at a refractive index of 1.64 for the measurement as precursor and at a refractive index of 1.73 for measurement after heat treatment at 350° C.

Synthesis Example 1

Synthesis of naphthoquinone diazide compound (1)

10.1 g (0.05 mol) of 4,4-dihydroxydiphenyl ether (result of calculation of dipole moment based on MOPAC-97=0.73 debye) and 47.0 g (0.175 mol) of 4-naphthoquinone diazide sulphonyl chloride were dissolved in 500 g of 1,4-dioxane under a current of dry nitrogen, and then warmed to 40° C. To this there was added, dropwise, 17.7 g (0.175 mol) of triethylamine mixed with 50 g of 1,4-dioxane, in such a way that the internal temperature of the system did not rise to more than 45° C. Following the dropwise addition, stirring was carried out for 2 hours at 40° C. The by-product triethylamine hydrochloride was filtered off and the filtrate poured into 3 litres of 1% hydrochloric acid, after which the precipitate which was deposited was collected by filtering. Washing was carried out twice with 10 litres of water, and drying performed for 20 hours in a vacuum dryer at 50° C. Naphthoquinone diazide compound (1) was obtained. (On average, 1.75 of the Q groups=4-naphthoquinone diazide sulphonyl groups and 0.25=hydrogen.)

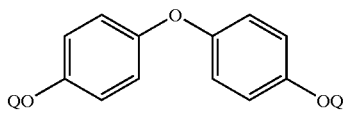

Synthesis Example 2

Synthesis of naphthoquinone diazide compound (2)

17.4 g (0.05 mol) of bis(4-hydroxyphenyl)2,2-dicyclohexylpropane (result of calculation of dipole moment based on MOPAC-97=0.23 debye) and 34.9 g (0.13 mol) of 5-naphthoquinone diazide sulphonyl chloride were dissolved in 400 g of 1,4-dioxane under a current of dry nitrogen, and then warmed to 40° C. To this there was added, dropwise, 13.1 g (0.13 mol) of triethylamine mixed with 40 g of 1,4-dioxane, and naphthoquinone diazide compound (2) obtained in the same way as in Synthesis Example 1. (On average, 2.6 of the Q groups=5-naphthoquinone diazide sulphonyl groups and the remainder=hydrogen.)

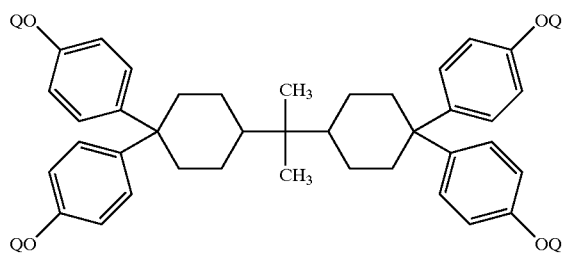

Synthesis Example 3

Synthesis of naphthoquinone diazide compound (3)

13.2 g (0.05 mol) of 3,3'-dimethyl-4,4'-dihydroxyphenyl thioether (result of calculation of dipole moment based on MOPAC-97=1.59 debye) and 34.9 g (0.13 mol) of 5-naphthoquinone diazide sulphonyl chloride were dissolved in 400 g of 1,4-dioxane under a current of dry nitrogen, and then warmed to 40° C. To this there was added, dropwise, 13.1 g (0.13 mol) of triethylamine mixed with 40 g of 1,4-dioxane, and naphthoquinone diazide compound (3) obtained in the same way as in Synthesis Example 1. (On average, 1.3 of the Q groups=5-naphthoquinone diazide sulphonyl groups and 0.7=hydrogen.)

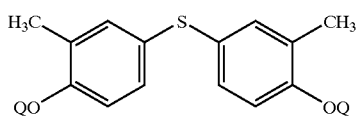

(On average, 1.3 of the Q groups=5-naphthoquinone diazide sulphonyl groups and 0.7=hydrogen.)

Synthesis Example 4

Synthesis of naphthoquinone diazide compound (4)

11.4 g (0.05 mol) of bisphenol A (result of calculation of dipole moment based on MOPAC-97=2.1 debye) and 34.9 g (0.13 mol) of 5-naphthoquinone diazide sulphonyl chloride were dissolved in 400 g of 1,4-dioxane under a current of dry nitrogen, and then warmed to 40° C. To this there was added, dropwise, 13.1 g (0.13 mol) of triethylamine mixed with 40 g of 1,4-dioxane, and then naphthoquinone diazide compound (4) was obtained in the same way as in Synthesis Example 1. (As an average, 1.3 of the Q groups=5-naphthoquinone diazide sulphonyl groups and 0.7=hydrogen.)

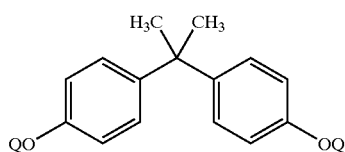

(As an average, 1.3 of the Q groups=5-naphthoquinone diazide sulphonyl groups and 0.7=hydrogen.)

Synthesis Example 5

Synthesis of a hydroxyl group-containing acid anhydride 18.3 g (0.05 mol) of 2,2-bis(3-amino-4-hydroxyphenyl) hexafluoropropane (BAHF) and 34.2 g (0.3 mol) of allyl glycidyl ether were dissolved in 100 g of gamma-butyrolactone (GBL) under a current of dry nitrogen, and then cooled to −15° C. To this, there was added dropwise 22.1 g (0.11 mol) of trimellitic anhydride chloride dissolved in 50 g of GBL, in such a way that the temperature of the reaction liquid did not exceed 0° C. Following the end of the dropwise addition, reaction was carried out for 4 hours at 0° C.

The solution was concentrated using a rotary evaporator, then poured into 1 litre of toluene and acid anhydride (1) obtained. The material obtained did not show a distinct melting point up to 350° C.

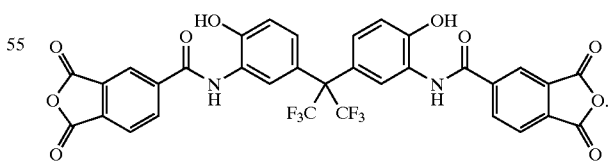

Synthesis Example 6

Synthesis of hydroxyl group-containing diamine compound (1)

18.3 g (0.05 mol) of BAHF was dissolved in 100 ml of acetone and 17.4 g (0.3 mol) of propylene oxide, and cooled to −15° C. To this, there was added dropwise a solution of 20.4 g (0.11 mol) of 3-nitrobenzoyl chloride dissolved in 100 ml of acetone. Following the end of the dropwise addition, reaction was carried out for 4 hours at −15° C., after which the temperature was returned to room temperature. The solution was then concentrated using a rotary evaporator and the solid obtained was washed with water and acetone, after which drying was carried out in a vacuum dryer at 80° C.

25 g of the dried solid and 2 g of 5% palladium/carbon were introduced into a 1000 ml three-necked flask along with 600 ml of Methyl Cellosolve, and the internal temperature raised to 60° C. To this, there was slowly added dropwise 3.5 g of saturated aqueous hydrazine. Following the end of the dropwise addition, stirring was carried out for 1 hour, and then the solution was filtered. The filtrate was concentrated to 200 ml using a rotary evaporator, after which the solution was poured into 1 litre of water and a precipitate of the target material obtained. This was dried for 20 hours in a vacuum dryer at 50° C.

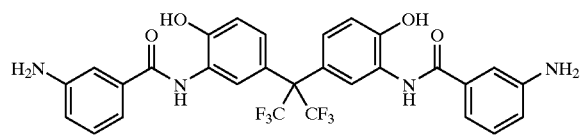

Synthesis Example 7

Synthesis of hydroxyl group-containing diamine (2)

30.8 g (0.2 mol) of 2-amino-4-nitrophenol was dissolved in 200 ml of acetone and 60 g (0.68 mol) of propylene oxide, and cooled to −15° C. To this, there was slowly added dropwise a solution of 22.4 g (0.11 mol) of isophthaloyl chloride dissolved in 200 ml of acetone. Following the end of the dropwise addition, reaction was carried out for 4 hours at −15° C, after which the temperature was returned to room temperature and the precipitate produced was collected by filtration.

30 g of the dried precipitate and 3 g of 5% palladium-carbon were introduced into a 1000 ml three-necked flask along with 800 ml of Methyl Cellosolve, and the internal temperature raised to 60° C. To this, there was slowly added dropwise 7 g of saturated aqueous hydrazine. Following the end of the dropwise addition, stirring was carried out for 1 hour at 60° C. Following completion of the stirring, the solution was filtered and the filtrate concentrated to 200 ml using a rotary evaporator. The solution was poured into 1.5 litres of water and the precipitate obtained was collected by filtering. This was dried under vacuum for 20 hours at 50° C. and the target compound obtained.

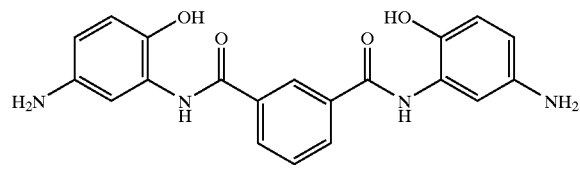

Synthesis Example 8

Synthesis of hydroxyl group-containing diamine compound (3)

15.4 g (0.1 mol) of 2-amino-4-nitrophenol was dissolved in 80 ml of acetone and 30 g (0.34 mol) of propylene oxide, and cooled to −15° C. To this, there was slowly added dropwise a solution of 19.5 g (0.105 mol) of 3-nitrobenzoyl chloride dissolved in 80 ml of acetone. Following the end of the dropwise addition, reaction was carried out for 4 hours at −15° C., after which the temperature was returned to room temperature and the precipitate produced was collected by filtering.

30 g of the dried precipitate and 3 g of 5% palladium-carbon were introduced into a 1000 ml three-necked flask along with 600 ml of Methyl Cellosolve, and the internal temperature raised to 60° C. To this, there was slowly added dropwise 8.5 g of saturated aqueous hydrazine. Following the end of the dropwise addition, stirring was carried out for 1 hour at 60° C. Following completion of the stirring, the solution was filtered and the filtrate concentrated to 200 ml using a rotary evaporator. The solution was poured into 1 litre of water and the precipitate obtained was collected by filtering. This was dried under vacuum for 20 hours at 50° C. and the target compound obtained.

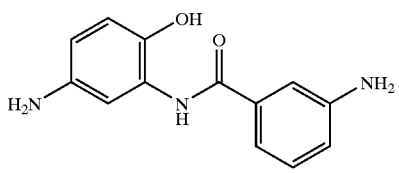

Synthesis Example 9

Synthesis of hydroxyl group-containing diamine compound (4)

18.3 g (0.05 mol) of BAHF was dissolved in 100 ml of acetone and 17.4 g (0.3 mol) of propylene oxide, and cooled to −15° C. To this, there was slowly added, dropwise, a solution of 20.4 g (0.11 mol) of 4-nitrobenzoyl chloride dissolved in 100 ml of acetone. Following the end of the dropwise addition, reaction was carried out for 4 hours at −15° C., after which the temperature was returned to room temperature. The white solid which precipitated was filtered off and dried under vacuum at 50° C.

30 g of the solid was placed in a 300 ml stainless steel autoclave, dispersed in 250 ml of Methyl Cellosolve, and then 2 g of 5% palladium-carbon added. Hydrogen was introduced therein by means of a balloon and a reduction reaction carried out at room temperature. After about 2 hours, when it was confirmed that the balloon did not deflate any further, the reaction was halted. Following completion of the reaction, filtering was carried out and the palladium compound catalyst was eliminated. Concentration was carried out with a rotary evaporator and diamine compound (4) obtained. The solid thus obtained was used for reaction as it was.

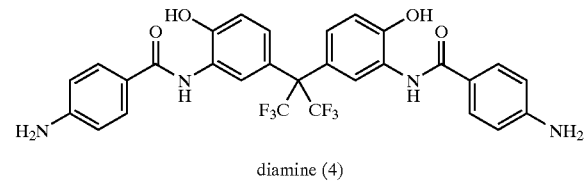

diamine (4)

Synthesis Example 10

Synthesis of quinonediazide compound (6)

16.10 g (0.05 mol) of BisRS-2P (commercial name, produced by the Honshu Chemical Industry Co.) and 26.86 g (0.1 mol) of 5-naphthoquinone diazide sulphonyl chloride were dissolved in 450 g of 1,4-dioxane under a current of dry nitrogen, and the temperature brought to room temperature. To this, there was added dropwise 10.12 g of triethylamine mixed with 50 g of 1,4-dioxane, while ensuring that the temperature within the system did not exceed 35° C. Following the dropwise addition, stirring was carried out for 2 hours at 30° C. The triethylamine salt was then filtered off and the filtrate poured into water, after which the deposited precipitate was collected by filtering. This precipitate was dried with a vacuum drier and quinone diazide compound (6) obtained.

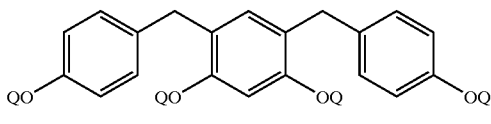

Quinone diazide compound (6)

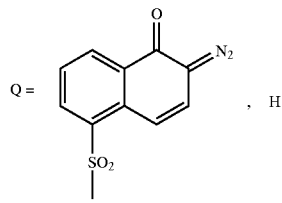

Q = , H

1:1

Synthesis Example 11

Synthesis of quinone diazide compound (7)

19.40 g (0.05 mol) of BisP-OCHP (commercial name, produced by the Honshu Chemical Industry Co.) and 26.86 g (0.1 mol) of 5-naphthoquinone diazide sulphonyl chloride were dissolved in 450 g of 1,4-dioxane under a current of dry nitrogen, and the temperature brought to room temperature. Thereafter, using 10.12 g of triethylamine mixed with 50 g of 1,4-dioxane, quinone diazide compound (7) was obtained in the same way as in Synthesis Example 10.

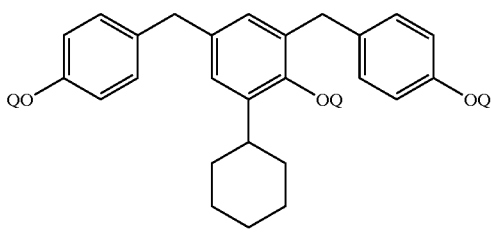

Quinone diazide compound (7)

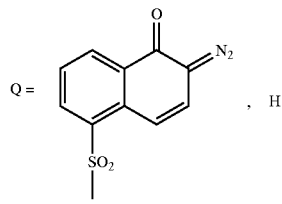

Q = , H

2:1

Synthesis Example 12

Synthesis of quinone diazide compound (8)

21.01 g (0.05 mol) of BisRS-OCHP (commercial name, produced by the Honshu Chemical Industry Co.) and 40.286 g (0.15 mol) of 5-naphthoquinone diazide sulphonyl chloride were dissolved in 450 g of 1,4-dioxane under a current of dry nitrogen, and the temperature brought to room temperature. Thereafter, using 15.18 g of triethylamine mixed with 50 g of 1,4-dioxane, quinone diazide compound (8) was obtained in the same way as in Synthesis Example 10.

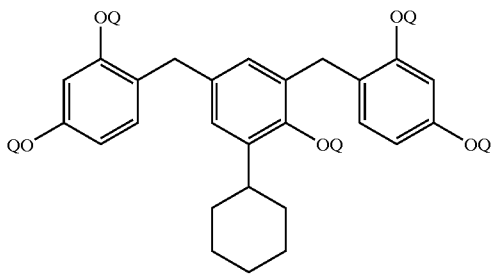

Quinone diazide compound (8)

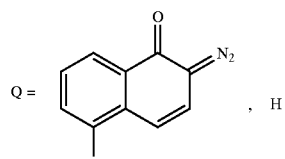

Q = , H

3:2

Synthesis Example 13

Synthesis of quinone diazide compound (9)

19.71 g (0.05 mol) of BisPG-26X (commercial name, produced by the Honshu Chemical Industry Co.), 13.56 g (0.05 mol) of 5-naphthoquinone diazide sulphonyl chloride and 13.14 g (0.05 mol) of 4-naphthoquinone diazide sulphonyl chloride were dissolved in 450 g of 1,4-dioxane under a current of dry nitrogen, and the temperature brought to room temperature. To this, there was added dropwise 10.12 g of triethylamine mixed with 50 g of 1,4-dioxane while ensuring that the temperature within the system did not exceed 35° C. Following the dropwise addition, stirring was carried out for 2 hours at 30° C. The triethylamine salt was then filtered off and the filtrate poured into water, after which the deposited precipitate was collected by filtering. This precipitate was dried with a vacuum drier and quinone diazide compound (9) obtained.

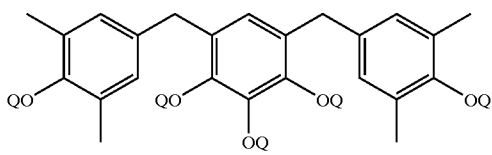

Quinone diazide compound (9)

-continued

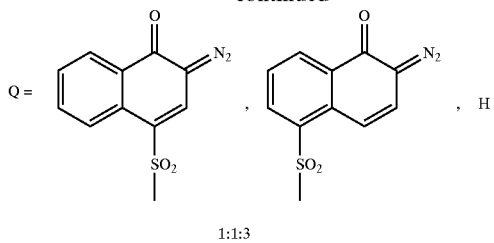

1:1:3

Synthesis Example 14

Synthesis of quinone diazide compound (10)

17.62 g (0.05 mol) of BIR-PC (commercial name, produced by the Asahi Organic Chemicals Industry Co.) and 26.86 g (0.1 mol) of 5-naphthoquinone diazide sulphonyl chloride were dissolved in 450 g of 1,4-dioxane under a current of dry nitrogen, and the temperature brought to room temperature. Thereafter, using 10.12 g of triethylamine mixed with 50 g of 1,4-dioxane, quinone diazide compound (10) was obtained in the same way as in Synthesis Example 10.

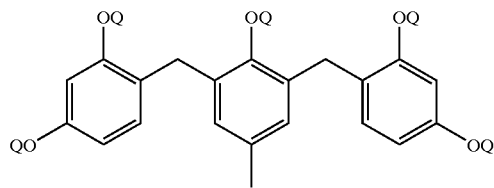

Quinone diazide compound (10)

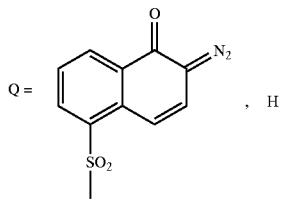

2:3

Synthesis Example 15

Synthesis of quinone diazide compound (11)

19.72 g (0.05 mol) of BIR-PTBP (commercial name, produced by the Asahi Organic Chemicals Industry Co.) and 26.86 g (0.1 mol) of 5-naphthoquinone diazide sulphonyl chloride were dissolved in 450 g of 1,4-dioxane under a current of dry nitrogen, and the temperature brought to room temperature. Thereafter, using 10.12 g of triethylamine mixed with 50 g of 1,4-dioxane, quinone diazide compound (11) was obtained in the same way as in Synthesis Example 10.

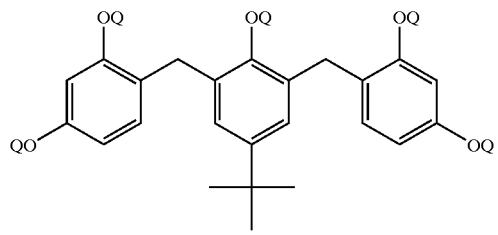

Quinone diazide compound (11)

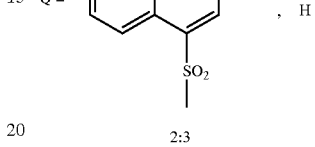

2:3

Synthesis Example 16

Synthesis of quinone diazide compound (12)

23.62 g (0.05 mol) of BIR-BIPC-F (commercial name, produced by the Asahi Organic Chemicals Industry Co.) and 40.29 g (0.15 mol) of 5-naphthoquinone diazide sulphonyl chloride were dissolved in 450 g of 1,4-dioxane under a current of dry nitrogen, and the temperature brought to room temperature. Thereafter, using 15.18 g of triethylamine mixed with 50 g of 1,4-dioxane, quinone diazide compound (12) was obtained in the same way as in Synthesis Example 10.

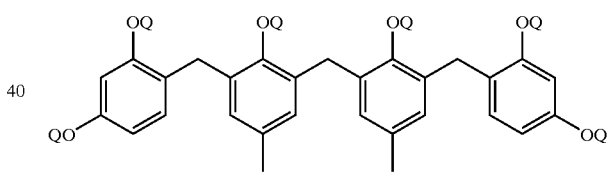

Quinone diazide compound (12)

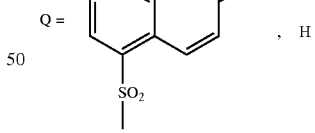

1:1

Synthesis Example 17

Synthesis of quinone diazide compound (13)

7.21 g (0.05 mol) of 2-naphthol and 13.43 g (0.05 mol) of 5-naphthoquinone diazide sulphonyl chloride were dissolved in 450 g of 1,4-dioxane under a current of dry nitrogen, and the temperature brought to room temperature. Thereafter, using 5.06 g of triethylamine mixed with 50 g of 1,4-dioxane, quinone diazide compound (13) was obtained in the same way as in Synthesis Example 10.

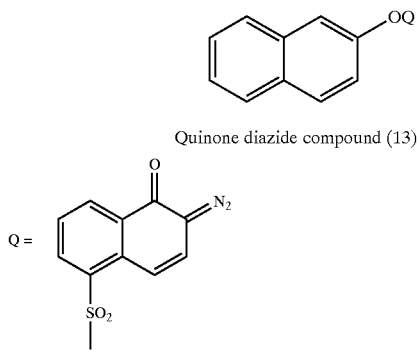

Quinone diazide compound (13)

Synthesis Example 18

Synthesis of quinone diazide compound (14)

15.31 g (0.05 mol) of TrisP-HAP (commercial name, produced by the Honshu Chemical Industry Co.) and 40.28 g (0.15 mol) of 5-naphthoquinone diazide sulphonyl chloride were dissolved in 450 g of 1,4-dioxane under a current of dry nitrogen, and the temperature brought to room temperature. Thereafter, using 15.18 g of triethylamine mixed with 50 g of 1,4-dioxane, quinone diazide compound (14) was obtained in the same way as in Synthesis Example 10.

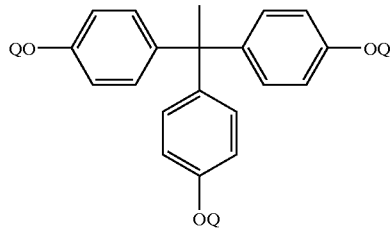

Quinone diazide compound (14)

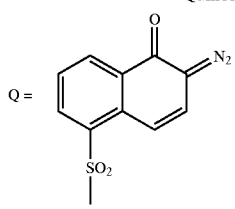

Synthesis Example 19

Synthesis of quinone diazide compound (15)

6.81 g (0.05 mol) of 4-isopropylphenol and 13.43 g (0.05 mol) of 5-naphthoquinone diazide sulphonyl chloride were dissolved in 450 g of 1,4-dioxane under a current of dry nitrogen, and the temperature brought to room temperature. Thereafter, using 5.06 g of triethylamine mixed with 50 g of 1,4-dioxane, quinone diazide compound (15) was obtained in the same way as in Synthesis Example 10.

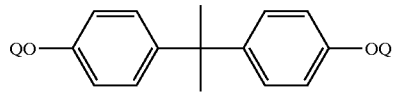

Naphthoquinone diazide compound (15)

Synthesis Example 20

Synthesis of quinone diazide compound (16)

11.41 g (0.05 mol) of bisphenol A and 26.86 g (0.1 mol) of 5-naphthoquinone diazide sulphonyl chloride were dissolved in 450 g of 1,4-dioxane under a current of dry nitrogen, and the temperature brought to room temperature. Thereafter, using 10.12 g of triethylamine mixed with 50 g of 1,4-dioxane, quinone diazide compound (16) was obtained in the same way as in Synthesis Example 10.

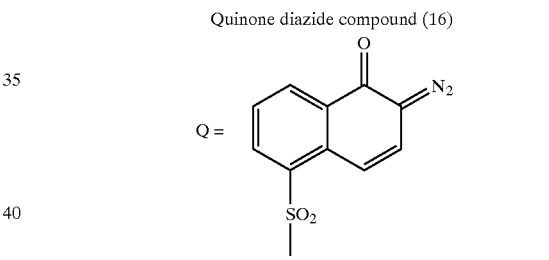

Quinone diazide compound (16)

Example 1

5.01 g (0.025 mol) of 4,4'-diaminophenyl ether and 1.24 g (0.005 mol) of 1,3-bis(3-aminopropyl)tetramethyl-disiloxane were dissolved in 50 g of N-methyl-2-pyrrolidone (NMP) under a current of dry nitrogen. To this solution, 21.4 g (0.03 mol) of the hydroxyl group-containing acid anhydride obtained in Synthesis Example 5 was added along with 14 g of NMP, and reaction carried out for 1 hour at 20° C., after which reaction was conducted for 4 hours at 50° C. Subsequently, a solution of 7.14 g (0.06 mol) of N,N-dimethylformamide dimethyl acetal diluted with 5 g of NMP was added dropwise over 10 minutes. Following the dropwise addition, stirring was carried out for 3 hours at 50° C. To 40.0 g of the solution thus obtained there was added 1.5 g of naphthoquinone diazide compound (1) obtained in Synthesis Example (1) and the photosensitive polyimide precursor composition, Varnish A, was obtained.

This photosensitive polyimide precursor composition, Varnish A, was coated onto a 6-inch silicon wafer to give a film thickness after prebaking of 5 μm, and then, by prebaking for 3 minutes at 120° C. using a hot plate (SCW-636 produced by Dainippon Screen Manufacturing Co.), there was obtained a photosensitive polyimide precursor film.

Next, by setting a reticule in which a pattern had been cut in an exposure means (g-line stepper NSR-1505-G6E, made by the Nikon Corp.), g-line exposure was carried out at an exposure level of 500 mJ/cm² (436 nm intensity).

Developing was performed using a SCW-635 developing device made by the Dainippon Screen Manufacturing Co., with a 10 second spray of 2.38% aqueous tetramethylammonium hydroxide solution at 50 revs. Thereafter, at 0 revs, it was left for 50 seconds, then a rinsing treatment carried out with water at 400 revs, and the water eliminated and drying effected for 10 seconds at 3000 revs. Following development, the film thickness in the unexposed regions was 4.6 µm and so the film loss by development was low at 0.4 µm, which was excellent. When the pattern after development was observed, there was found to be the 3 µm pattern resolution required as a semiconductor buffer coat and there were no problems with the pattern shape.

Example 2

15.1 g (0.025 mol) of hydroxyl group-containing diamine (1) obtained in Synthesis Example 6 was dissolved in 50 g of N-methyl-2-pyrrolidone (NMP) under a current of dry nitrogen. To this solution, 17.5 g (0.025 mol) of the hydroxyl group-containing acid anhydride obtained in Synthesis Example 5 was added along with 30 g of pyridine, and reaction carried out for 6 hours at 60° C. Following reaction, the solution was poured into 2 litres of water and the polymer solid which precipitated was collected by filtering. The polymer solid was dried for 20 hours using a vacuum dryer at 80° C. 10 g of the polymer solid thus obtained was weighed out and dissolved in 30 g of GBL along with 2 g of naphthoquinone diazide compound (2) and 1 g of vinyltrimethoxysilane, and the photosensitive polyimide precursor composition, Varnish B, obtained.

Using Varnish B, a photosensitive polyimide precursor film was obtained in the same way as in Example 1 on a 4-inch silicon wafer. Next, by setting a mask in which a pattern had been cut on an exposure means (contact aligner-PLA-501F, made by Cannon Inc.), exposure was carried out at an exposure level of 400 mJ/cm² (365 nm intensity).

Developing was performed in the same way as in Example 1 except that there was used 0.6% tetramethylammonium hydroxide aqueous solution as the developer and the film was left for 90 seconds at 0 revs. Following development, the film thickness in the unexposed regions was 4.7 µm and so the film loss by development was low at 0.3 µm, which was excellent. When the pattern after development was observed using an optical microscope, there was found to be the 10 µm line resolution and there were no problems with the pattern shape.

Example 3

17.0 g (0.045 mol) of hydroxyl group-containing diamine compound (2) obtained in Synthesis Example 7 and 1.24 g (0.005 mol) of 1,3-bis(3-aminopropyl)tetramethyldisiloxane were dissolved in 50 g of NMP under a current of dry nitrogen. To this solution, 12.4 g (0.04 mol) of 3,3',4, 4'-diphenyl ether tetracarboxylic anhydride was added along with 21 g of NMP, and reaction carried out for 1 hour at 20° C., followed by 2 hours at 50° C. Next, there was added thereto 0.98 g (0.01 mol) of maleic anhydride and stirring carried out for 2 hours at 50° C., after which there was added dropwise over 10 minutes a solution of 14.7 g (0.1 mol) of N,N-dimethylformamide diethyl acetal diluted with 5 g of NMP. Following the dropwise addition, stirring was carried out for 3 hours at 50° C. 1.6 g of the naphthoquinone diazide compound (2) obtained in Synthesis Example 2 was dissolved in 30 g of the solution obtained, and the photosensitive polyimide precursor composition, Varnish C, obtained.

Using Varnish C, a photosensitive polyimide precursor film was obtained in the same way as in Example 1. Next, exposure was carried out in the same way as in Example 1 except that i-line exposure was carried out at an exposure level of 400 mJ/cm² (365 nm intensity). Developing was performed in the same way as in Example 1 except that the film was left for 40 seconds at 0 revs. Following development, the film thickness in the unexposed regions was 4.6 µm and so the film loss by development was low at 0.4 µm, which was excellent.

When the pattern after development was observed, there was found to be the 3 µm pattern resolution required as a semiconductor buffer coat and there were no problems with the pattern shape.

Example 4

6.08 g (0.025 mol) of hydroxyl group-containing diamine compound (3) obtained in Synthesis Example 8, 4.51 g (0.0225 mol) of 4,4'-diaminodiphenyl ether and 0.62 g (0.0025 mol) of 1,3-bis(3-aminopropyl) tetramethyldisiloxane were dissolved in 70 g of NMP under a current of dry nitrogen. 24.99 g (0.035 mol) of the hydroxyl group-containing acid anhydride obtained in Synthesis Example 5, 4.41 g (0.015 mol) of 3,3',4,4'-biphenyltetracarboxylic dianhydride were added along with 25 g of NMP at room temperature, and stirring carried out for 1 hour at room temperature, followed by 2 hours at 50° C. Next, there was added thereto a solution of 17.6 g (0.2 mol) of glycidyl methyl ether diluted with 10 g of NMP, and stirring carried out for 6 hours at 70° C. In 40 g of this polymer solution, there was dissolved 2.5 g of the naphthoquinone diazide compound (3) obtained in Synthesis Example 3, and the photosensitive polyimide precursor composition, Varnish D, obtained.

Using Varnish D, a photosensitive polyimide precursor film was obtained in the same way as in Example 1. Next, exposure was carried out in the same way as in Example 1 except that exposure was carried out at an exposure level of 800 mJ/cm² (365 nm intensity). Developing was performed in the same way as in Example 1 except that there was used a 1.2% aqueous solution of tetramethyl-ammonium hydroxide and the film was left for 30 seconds at 0 revs. Following development, the film thickness in the unexposed regions was 4.2 µm and so the film loss by development was 0.6 µm. The sensitivity was slightly lowered at an exposure level of 800 mJ/cm². When the pattern after development was observed with an optical microscope, there was found to be 15 µm line resolution.

Example 5

36.6 g (0.1 mol) of bis(3-amino-4-hydroxyphenyl) hexafluoropropane was dissolved in 150 ml of N,N-dimethylacetamide and the temperature of the solution cooled to −10° C. To this, 58 g (1 mol) of propylene oxide was added. Next, thee was added dropwise, in such a way that the internal temperature did not exceed 10° C., a solution obtained by dissolving 10.2 g (0.05 mol) of isophthalic acid dichloride and 14.8 g (0.05 mol) of 4,4'-dicarboxydiphenyl ether dichloride in 100 ml of acetone. Following the end of the dropwise addition, stirring was carried out for 2 hours at −10° C., after which the solution was brought up to 20° C. over 1 hour. Stirring was then performed for 2 hours at 20° C. Following the end of the stirring, the solution was poured into a solution mixture of 3 litres of water and 2 litres of methanol, and a polyhydroxyamide solid obtained. This solid was collected by filtering and washed twice with 2 litres of aqueous 30% methanol. Following the washing, drying was carried out for 20 hours using a vacuum dryer at 80° C.

After the completion of the drying, 10 g of the solid polymer obtained was weighed out and, to this, there was added 1.6 g of the naphthoquinone diazide compound (2) synthesized in Synthesis Example 2. These were then dissolved in 25 g of gamma butyrolactone and 0.5 g of vinyltrimethoxysilane, and the photosensitive polybenzoxazole precursor, Varnish E, was obtained.

Using Varnish E, a photosensitive precursor film was obtained in the same way as in Example 1. Next, exposure was carried out in the same way as in Example 1 except that i-line exposure was carried out at an exposure level of 400 mJ/cm² (365 nm intensity). Developing was performed in the same way as in Example 1 except that the film was left for 90 seconds at 0 revs. Following development, the film thickness in the unexposed regions was 4.6 μm and so the film loss by development was low, at 0.4 μm, which was excellent.

Comparative Example 1

Photosensitive polyimide precursor composition, Varnish F, was obtained by dissolving 1.8 g of the naphthoquinone diazide compound (4) synthesized in Synthesis Example 4, in 40 g of polyimide precursor solution synthesized in the same way as in Example 1. When evaluation of the pattern processability was carried out in the same way as in Example 1, the film loss due to development was 1.4 μm and, furthermore, the developing time, at 100 seconds, was twice as long compared to that in Example 1. Thus, film loss was considerable and there was the problem of a long developing time.

Comparative Example 2

Photosensitive polyimide precursor composition, Varnish G, was obtained by dissolving 1.6 g of a naphthoquinone diazide compound where an average of three 4-naphthoquinone diazide sulphonic acids had been introduced onto 2,3,4,4'-tetrahydroxybenzophenone (4NT(4)-300 produced by the Toyogosei Co.; the dipole moment of the phenol compound=3.1 debye), in 30 g of polyimide precursor solution synthesized in the same way as in Example 3. When evaluation of the pattern processability was carried out in the same way as in Example 3, the film loss due to development was 2 μm and, furthermore, the developing time, at 120 seconds, was extended three times compared to Example 3. Thus, the film loss was considerable and there was also the problem of a long developing time.

Comparative Example 3

Photosensitive heat-resistant resin precursor composition, Varnish H, was obtained by dissolving 10 g of the polyhydroxyamide synthesized in Example 5 and 1.8 g of the naphthoquinone diazide compound (4NT-300) of Comparative Example 2 in 25 g of gamma butyrolactone and 0.5 g of vinyltrimethoxysilane. When evaluation of the pattern processability was carried out in the same way as in Example 5, the film loss due to development was 2.4 μm and, furthermore, the developing time, at 300 seconds, was extended more than three times compared to Example 5. Thus, the film loss was considerable and there was also the problem of a long developing time.

TABLE 1

|  | Naphthoquinone Diazide Compound | Exposure Level (mJ/cm²) | Film Loss (μm) | Resolution (μm) |
| --- | --- | --- | --- | --- |
| Example 1 | (1) | 500 | 0.4 | 3 |
| Example 2 | (2) | 400 | 0.3 | 10 |
| Example 3 | (2) | 400 | 0.4 | 3 |
| Example 4 | (2) | 800 | 0.8 | 5 |
| Example 5 | (3) | 400 | 0.4 | — |
| Comparative Example 1 | (4) | 500 | 1.4 | — |
| Comparative Example 2 | 4NT(4)-300 | 400 | 2 | — |
| Comparative Example 3 | 4NT(4)-300 | 400 | 2.4 | — |

Examples 6 to 22, Comparative Examples 4 to 9

In the examples below, evaluation was carried out under the following conditions.

Measurement of Film Thickness

Using a Lamda Ace STM-602 produced by the Dainippon Screen Manufacturing Co., measurement was carried out at a refractive index of 1.64 at the time of measurement of the precursor and at a refractive index of 1.73 at the time of measurement after heat treatment at 350° C.

Production of the Photosensitive Polyimide Precursor Film

The photosensitive heat-resistant resin precursor composition (referred to as the varnish below) was coated onto a 6-inch silicon wafer to give a film thickness after prebaking of 7 μm and then, by prebaking for 3 minutes at 120° C. using a hot plate (Mark-7, produced by the Tokyo Electron Co.), there was obtained a photosensitive polyimide precursor film.

Exposure

A reticule in which a pattern had been cut was set in an exposure means (i-line stepper DSW-8000, made by the GCA Co.), and i-line exposure was carried out while varying the exposure time (365 nm intensity).

Development

Developing was performed using a Tokyo Electron Co. Mark-7 developing device, with a 10 second duration spray of 2.38% aqueous tetramethylammonium hydroxide solution at 50 revs. Subsequently, after leaving for 60 seconds at 0 revs, a rinsing treatment carried out with water at 400 revs, and the water spun off and drying effected for 10 seconds at 3000 revs.

Calculation of the Percentage Film Remaining

Calculation of the percentage film remaining was carried out based on the following relationship.

remaining film (%)=film thickness after developing÷film thickness after prebaking×100

Calculation of the Sensitivity

The exposure time (referred to below as the optimum exposure time) to form a 50 μm line-and-space pattern (IL/IS) of 1:1 width, after exposure and development, was determined.

Calculation of the Resolution

The smallest pattern dimension at the optimum exposure time to form a 50 μm line-and-space pattern (IL/IS) of 1:1 width, after exposure and development, was taken as the resolution.

Calculation of the Shrinkage

Using a Koyo Lindbergh Co. inert oven INH-21CD, the photosensitive polyimide precursor film produced was heat treated for 30 minutes at 140° C. under a current of nitrogen (oxygen concentration less than 20 ppm), then the temperature raised to 350° C. over 1 hour and heat treatment carried out for 1 hour at 350° C., and a cured film produced. The shrinkage was calculated using the following relationship.

shrinkage (%)=(film thickness after prebaking−cured film thickness)÷film thickness after prebaking×100

Example 6

5.01 g (0.025 mol) of 4,4'-diaminophenyl ether and 1.24 g (0.005 mol) of 1,3-bis(3-aminopropyl)tetramethyldisiloxane were dissolved in 50 g of N-methyl-2-pyrrolidone (NMP) under a current of dry nitrogen. To this solution, 21.4 g (0.03 mol) of the hydroxyl group-containing acid anhydride obtained in Synthesis Example 1 was added along with 14 g of NMP, and reaction carried out for 1 hour at 20° C., after which reaction was conducted for 4 hours at 50° C. Subsequently, a solution of 7.14 g (0.06 mol) of N,N-dimethylformamide dimethyl acetal diluted with 5 g of NMP was added dropwise over 10 minutes. Following the dropwise addition, stirring was carried out for 3 hours at 50° C.

To 40.0 g of the solution obtained, 2.0 g of the quinone diazide compound (13) obtained in Synthesis Example 17 and 1.0 g of the phenolic hydroxyl group-containing compound BisRS-2P (commercial name, produced by Honshu Chemical Industry Co.) used in the present invention were added, and the photosensitive polyimide precursor composition, Varnish AA, was obtained. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 7

15.1 g (0.025 mol) of hydroxyl group-containing diamine (4) obtained in Synthesis Example 7 was dissolved in 50 g of N-methyl-2-pyrrolidone (NMP) under a current of dry nitrogen. To this solution, 17.5 g (0.025 mol) of the hydroxyl group-containing acid anhydride obtained in Synthesis Example 1 was added along with 30 g of pyridine, and reaction carried out for 6 hours at 60° C. Following reaction, the solution was poured into 2 litres of water and the precipitate of polymer solid collected by filtering. The polymer solid was dried for 20 hours using a vacuum dryer at 80° C.

10 g of the polymer solid thus obtained was weighed out and dissolved in 30 g of GBL along with 2 g of the quinone diazide compound (14) obtained in Synthesis Example 18, 2.0 g of the phenolic hydroxyl group-containing compound BisPG-26X (commercial name, produced by Honshu Chemical Industry Co.) used in the present invention and 1 g of vinyltrimethoxysilane, and the photosensitive polyimide precursor composition, Varnish AB, was obtained. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 8

17.0 g (0.045 mol) of hydroxyl group-containing diamine compound (2) obtained in Synthesis Example 3 and 1.24 g (0.005 mol) of 1,3-bis(3-aminopropyl)tetramethyldisiloxane were dissolved in 50 g of NMP under a current of dry nitrogen. To this solution, 12.4 g (0.04 mol) of 3,3',4,4'-diphenyl ether tetracarboxylic anhydride was added along with 21 g of NMP, and reaction carried out for 1 hour at 20° C., followed by 2 hours at 50° C. Next, there was added thereto 0.98 g (0.01 mol) of maleic anhydride and stirring carried out for 2 hours at 50° C., after which there was added dropwise over 10 minutes a solution of 14.7 g (0.1 mol) of N,N-dimethylformamide diethyl acetal diluted with 5 g of NMP. Following the dropwise addition, stirring was carried out for 3 hours at 50° C.

1.6 g of the quinone diazide compound (15) obtained in Synthesis Example 19 and 0.8 g of the phenolic hydroxyl group-containing compound BisRS-3P (commercial name, produced by Honshu Chemical Industry Co.) used in the present invention were dissolved in 30 g of the solution obtained, and the photosensitive polyimide precursor composition, Varnish C, obtained. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 9

6.08 g (0.025 mol) of the hydroxyl group-containing diamine (3) obtained in Synthesis Example 4, 4.51 g (0.0225 mol) of 4,4'-diaminodiphenyl ether and 0.62 g (0.0025 mol) of 1,3-bis(3-aminopropyl)tetramethyldisiloxane were dissolved in 70 g of NMP under a current of dry nitrogen. 24.99 g (0.035 mol) of the acid anhydride obtained in Synthesis Example 1 and 4.41 g (0.015 mol) of 3,3',4,4'-biphenyltetracarboxylic dianhydride were added along with 25 g of NMP at room temperature, and stirring carried out for 1 hour at room temperature, followed by 2 hours at 50° C. Next, there was added thereto a solution of 17.6 g (0.2 mol) of glycidyl methyl ether diluted with 10 g of NMP, and stirring carried out for 6 hours at 70° C.

2.5 g of the quinone diazide compound (16) obtained in Synthesis Example 20 and 2.0 g of the phenolic hydroxyl group-containing compound BisP-OCHP (commercial name, produced by Honshu Chemical Industry Co.) used in the present invention were dissolved in 40 g of the solution obtained above, and the photosensitive polyimide precursor composition, Varnish D, obtained. in the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 10

Photosensitive polyimide precursor composition, Varnish AE, was obtained by dissolving 2.5 g of the quinone diazide compound (13) used in Example 6 and 2.0 g of the phenolic hydroxyl group-containing compound BIR-PC (commercial name, produced by the Asahi Organic Chemicals Industry Co.) used in the present invention, in 50 g of the polymer solution obtained in Example 8. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 11

Photosensitive polyimide precursor composition, Varnish AF, was obtained by dissolving 2.0 g of the quinone diazide compound (14) used in Example 7 and 2.0 g of the phenolic hydroxyl group-containing compound BIR-PTBP (commercial name, produced by the Asahi Organic Chemicals Industry Co.) used in the present invention, in 40 g of the polymer solution obtained in Example 6. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 12

Photosensitive polyimide precursor composition, Varnish AG, was obtained by dissolving 2.0 g of the quinone diazide compound (14) used in Example 7 and 2.0 g of the phenolic hydroxyl group-containing compound BIR-BIPC-P (commercial name, produced by the Asahi Organic Chemicals Industry Co.) used in the present invention, in 40 g of the polymer solution obtained in the Example. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 13

18.3 g (0.05 mol) of 2,2-bis(3-amino-4-hydroxyphenyl) hexafluoropropane was dissolved in 50 g of N-methyl-2-pyrrolidone (NMP) and 26.4 g (0.3 mol) of glycidyl methyl ether under a current of dry nitrogen, and the temperature of the solution cooled to −15° C. To this, there was added dropwise, in such a way that the internal temperature did not exceed 0° C., a solution of 7.38 g (0.025 mol) of diphenyl ether dicarboxylic acid dichloride and 5.08 g (0.025 mol) of isophthalic acid dichloride dissolved in 25 g of gamma butyrolactone. Following the end of the dropwise addition, stirring was continued for 6 hours at −15° C.

After the end of the reaction, the solution was poured into 3 litres of water and a white precipitate was collected. This precipitate was recovered by filtration and washed three times with water, after which it was dried for 20 hours in a vacuum dryer at 80° C.

10.0 g of the polymer powder obtained in this way, together with 2.0 g of quinone diazide compound (14) and 1.0 g of the phenolic hydroxyl group-containing compound BisRS-2P (commercial name, produced by Honshu Chemical Industry Co.) used in the present invention were dissolved in 30 g of NMP, and photosensitive polybenzoxazole precursor composition, Varnish AH, obtained. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Comparative Example 4

Photosensitive polyimide precursor composition, Varnish AI, was obtained by dissolving 2.0 g of the quinone diazide compound (13) used in Example 6 in 40 g of polyimide precursor solution synthesized in the same way as in Example 6. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Comparative Example 5

Photosensitive polyimide precursor composition, Varnish AJ, was obtained by dissolving 2.0 g of the quinone diazide compound (13) used in Example 6 and 1.0 g of TrisP-PA (commercial name, Honshu Chemical Industry Co.) in 40 g of polyimide precursor solution synthesized in the same way as in Example 6. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Comparative Example 6

Photosensitive polyimide precursor composition, Varnish AK, was obtained by dissolving 1.6 g of the quinone diazide compound (15) used in Example 8 and 0.8 g of BisP-AP (commercial name, made by the Honshu Chemical Industry Co.) in 30 g of polyimide precursor solution synthesized in the same way as in Example 8. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 14

57.4 g (0.095 mol) of diamine compound (4) obtained in Synthesis Example 7 and 1.24 g (0.005 mol) of 1,3-bis(3-aminopropyl)tetramethyldisiloxane were dissolved in 350 g of GBL under a current of dry nitrogen. To this, 32.2 g (0.1 mol) of 3,3',4,4'-benzophenonetetracarboxylic dianhydride was added along with 40 g of GBL, and stirring carried out for 1 hour at 20° C., followed by 4 hours reaction at 50° C. 20.0 g of quinone diazide compound (6) obtained in Synthesis Example 10 was added to the solution obtained, along with 10 g of GBL, and photosensitive polyimide precursor composition, Varnish AL, obtained.

In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 15

15.1 g (0.025 mol) of diamine compound (2) obtained in Synthesis Example 3, 4.5 g (0.0225 mol) of 4,4'-diaminodiphenyl ether and 0.62 g (0.0025 mol) of 1,3-bis (3-aminopropyl)tetramethyldisiloxane were dissolved in 100 g of GBL under a current of dry nitrogen. To this, 16.1 g (0.050 mol) of 3,3',4,4'-benzophenonetetracarboxylic dianhydride was added along with 33 g of GBL, and stirring carried out for 1 hour at room temperature, followed by 4 hours reaction at 50° C. 7.6 g of quinone diazide compound (7) obtained in Synthesis Example 11 was added to 50 g of this polymer solution, and photosensitive polyimide precursor composition, Varnish AM, obtained.

In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 16

Polymer was obtained in the same way as in Example 15, except that, instead of diamine compound (4), there was used 23.0 g (0.095 mol) of the diamine compound obtained in Synthesis Example 4. By dissolving 9.5 g of quinone diazide compound (8), obtained in Synthesis Example 12, in 50 g of this polymer solution, photosensitive polyimide precursor composition, Varnish AN, was obtained.

In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 17

19.0 g (0.095 mol) of 4,4'-diaminodiphenyl ether and 1.24 g (0.005 mol) of 1,3-bis(3-aminopropyl) tetramethyldisiloxane were dissolved in 350 g of GBL under a current of dry nitrogen. To this, 71.4 g (0.1 mol) of acid anhydride (1) obtained in Synthesis Example 1 was added along with 40 g of GBL, and reaction carried out for 1 hour at 20° C., followed by 4 hours reaction at 50° C. 20.0 g of quinone diazide compound (9) obtained in Synthesis Example 13 was added to 50 g of this polymer solution, along with 10 g of GBL, and photosensitive polyimide precursor composition, Varnish AO, obtained.

In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 18

Photosensitive polyimide precursor composition, Varnish AP, was obtained by dissolving 3.6 g of quinone diazide compound (6) obtained in Synthesis Example 10 and 4.0 g of quinone diazide compound (14) obtained in Synthesis Example 18 in 50 g of the polymer solution obtained in Example 8. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 19

Photosensitive polyimide precursor composition, Varnish Q, was obtained by dissolving 7.6 g of quinone diazide compound (10), obtained in Synthesis Example 14, in 50 g of the polymer solution obtained in Example 15. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 20

Photosensitive polyimide precursor composition, Varnish AR, was obtained by dissolving 3.6 g of quinone diazide compound (11), obtained in Synthesis Example 15, and 4.0 g of quinone diazide compound (14), obtained in Synthesis Example 18, in 50 g of the polymer solution obtained in Example 8. In the manner described above, a photosensitive polyimide precursor film was prepared on a silicon wafer using the varnish obtained, then exposure and developing carried out, and evaluation performed of the varnish sensitivity, percentage film remaining, resolution and shrinkage Example 21

Photosensitive polyimide precursor composition, Varnish AS, was obtained by dissolving 7.6 g of quinone diazide compound (11), obtained in Synthesis Example 16, in 50 g of the polymer solution obtained in Example 9. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Example 22

Photosensitive polybenzoxazole precursor composition, Varnish AT, was obtained by dissolving 10.0 g of the polymer powder obtained in Example 9 and 2.0 g of quinone diazide compound (6), obtained in Synthesis Example 10, in 30 g of N-methyl-2-pyrrolidone (NMP). In the manner described above, a photosensitive polyimide precursor film was prepared on a silicon wafer using the varnish obtained, then exposure and developing carried out,. and evaluation performed of the varnish sensitivity, percentage film remaining, resolution and shrinkage.

Comparative Example 7

Photosensitive polyimide precursor composition, Varnish AU, was obtained by dissolving 10 g of the polymer obtained in Example 9 and 2 g of quinone diazide compound (14) obtained in Synthesis Example 19, in 45 g of GBL. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Comparative Example 8

Photosensitive polyimide precursor composition, Varnish AV, was obtained by dissolving 10 g of the polymer obtained in Example 10 and 2 g of quinone diazide compound (16) obtained in Synthesis Example 20, in 45 g of GBL. In the manner described above, a photosensitive polyimide precursor film was prepared on a silicon wafer using the varnish obtained, then exposure and developing carried out, and evaluation performed of the varnish sensitivity, percentage film remaining, resolution and shrinkage.

Comparative Example 9

Polymer was synthesized in the same way as in Example 12 using 32.2 g (0.1 mol) of 3,3',4,4'-benzophenonetetracarboxylic dianhydride instead of the acid anhydride (1) of Example 12.

Photosensitive polyimide precursor composition, Varnish AW, was obtained by adding 10.0 g of quinone diazide compound (9), obtained in Synthesis Example 18, and 10.0 g of the naphthoquinone diazide compound (16) obtained in Synthesis Example 18, to 50 g of the aforesaid polymer solution, along with 10 g of GBL. In the manner described above, a photosensitive polyimide precursor film was prepared on a silicon wafer using the varnish obtained, then exposure and developing carried out, and evaluation performed of the varnish sensitivity, percentage film remaining, resolution and shrinkage The evaluation results for Examples 6 to 13, and Comparative Examples 4 to 6, are shown in Table 2 below, and those for Examples 14 to 22, and Comparative Examples 7 to 9, are shown in Table 3 below. The phenolic hydroxyl group-containing compounds used in Examples 6 to 13 and in Comparative Examples 5 and 6, are shown below.

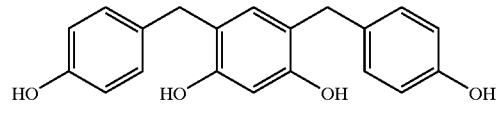

BisRS-2P

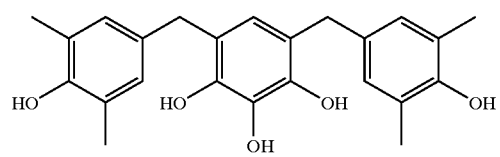

BisPG-26X

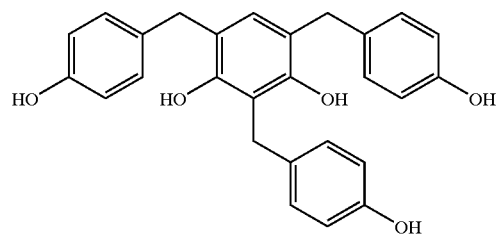

BisRS-3P

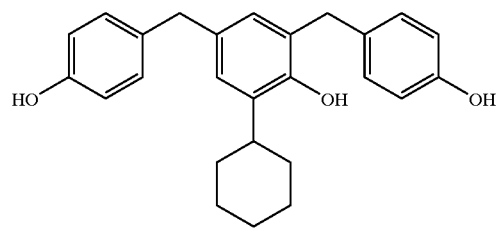

BisP-OCHP

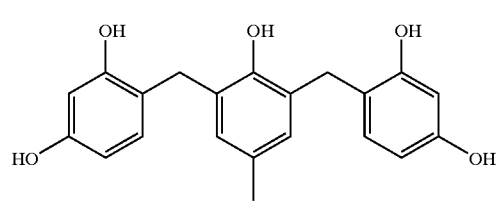

BIR-PC

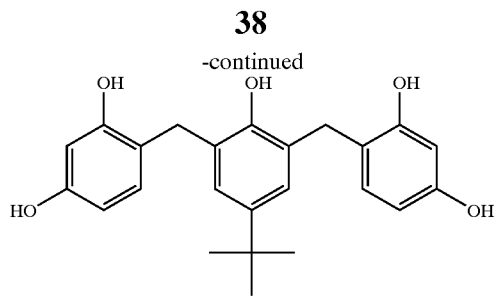

BIR-PTBP

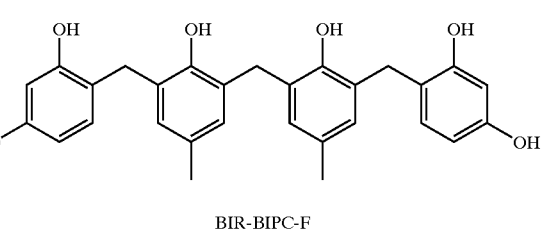

BIR-BIPC-F

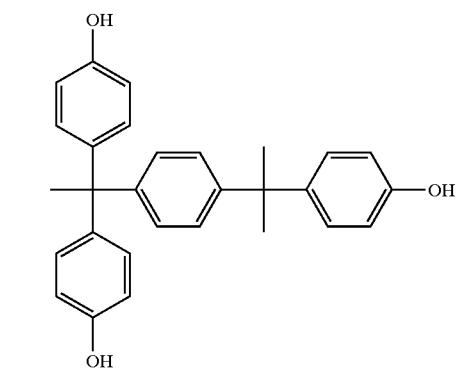

TrisP-PA

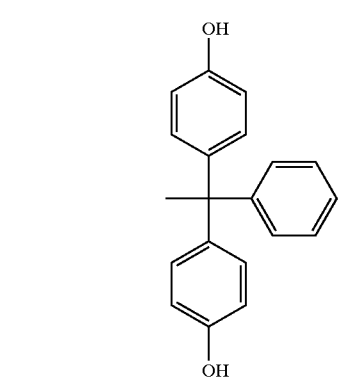

BisP-AP

TABLE 2

| | Naphthoquinone Diazide Compound | Phenolic Compound | Sensitivity (msec) | Remaining Film (%) | Resolution (μm) | Shrinkage (%) |
|---|---|---|---|---|---|---|
| Example 6 | (13) | BisRS-2P | 900 | 90 | 15 | 29 |
| Example 7 | (14) | BisPG-26P | 1000 | 90 | 15 | 30 |
| Example 8 | (15) | BisRS-3P | 850 | 89 | 15 | 32 |
| Example 9 | (16) | BisP-OCHP | 1050 | 90 | 15 | 33 |
| Example 10 | (13) | BIR-PC | 950 | 89 | 15 | 31 |
| Example 11 | (14) | BIR-PTBT | 1050 | 91 | 15 | 33 |
| Example 12 | (14) | BIR-BIPC-F | 1000 | 90 | 15 | 30 |
| Example 13 | (14) | BisRS-2P | 1300 | 87 | 15 | 35 |
| Comp. Ex. 4 | (13) | none | 1800 | 85 | 30 | 38 |
| Comp. Ex. 5 | (13) | TrsP-PA | 1600 | 85 | 20 | 40 |
| Comp. Ex. 6 | (15) | BisP-AP | 1550 | 84 | 20 | 40 |

The sensitivity units of msec denote the stepper exposure time, 100 msec = 50 mJ/cm².

TABLE 3

| | Naphthoquinone Diazide Compound | Sensitivity (msec) | Film Remaining (%) | Resolution (μm) |
|---|---|---|---|---|
| Example 14 | (6) | 950 | 88 | 10 |
| Example 15 | (7) | 1100 | 87 | 10 |
| Example 16 | (8) | 1050 | 88 | 10 |
| Example 17 | (9) | 900 | 88 | 10 |
| Example 18 | (14) | 1000 | 90 | 10 |
| Example 19 | (10) | 1150 | 90 | 10 |
| Example 20 | (11), (14) | 950 | 88 | 10 |
| Example 21 | (12) | 1000 | 87 | 10 |
| Example 22 | (6) | 1300 | 87 | 15 |
| Comparative Example 7 | (13) | 1400 | 85 | 40 |
| Comparative Example 8 | (16) | 1500 | 85 | 40 |
| Comparative Example 9 | (13), (16) | 1600 | 84 | 30 |

The sensitivity units of msec denote the stepper exposure time, 100 msec = 50 mJ/cm².

Industrial Application Potential

In accordance with the present invention, by adding a specified naphthoquinone diazide compound to a polyimide precursor of specified structure, it is possible to obtain a positive type heat-resistant resin composition which shows little film loss in the unexposed regions due to the developing and, furthermore, can be developed in a short time.

What is claimed is:

1. A positive photosensitive resin precursor composition which is characterized in that it contains polymer having, as its chief component, structural units represented by the following general formula (1) and, furthermore, in that it comprises the following components (a) and/or (b):

(a) a phenol compound of dipole moment 0.1 to 1.6 debye and/or an ester derived from the phenol compound and a naphthoquinone diazide sulphonic acid;

(b) a phenol compound represented by general formula (8) and/or an ester derived from the phenol compound and a naphthoquinone diazide sulphonic acid:

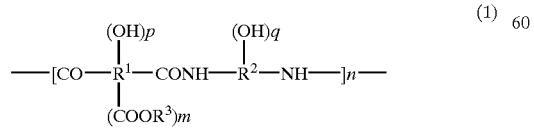

wherein, in general formula (1), $R^1$ represents a bivalent to octavalent organic group with at least two carbon atoms, $R^2$ represents a bivalent to hexavalent organic group with at least two carbon atoms, and $R^3$ represents hydrogen or an organic group with from one to ten carbons, n is an integer in the range of 10 to 100,000, m is an integer in the range of 1 to 2, and p and q are integers in the range of 0 to 4, but p and q are not simultaneously 0; and wherein the selected component (a) and/or (b) includes an ester derived from the phenol compound and a naphthoquinone diazide sulphonic acid;

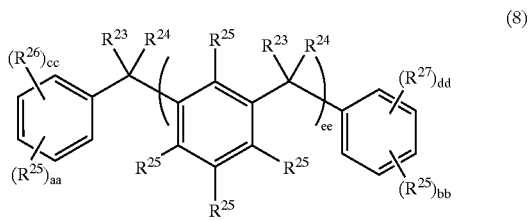

wherein $R^{23}$, $R^{24}$, $R^{26}$ and $R^{27}$ each represents a hydrogen atom or a $C_{1-8}$ alkyl group, alkoxy group, carboxyl group or ester group, at least one $R^{25}$ is a hydroxyl group, and the rest represents hydrogen atoms or $C_{1-8}$ alkyl groups; aa, bb, cc and dd represent integers in the range 0 to 3, where aa+bb≦5, bb+dd≦5 and aa +bb>0, and ee represents an integer in the range 1 to 3.

2. A positive photosensitive resin precursor composition according to claim 1 which satisfies condition (a).

3. A positive photosensitive resin precursor composition according to claim 2 where the phenol compound of dipole moment 0.1 to 1.6 debye is a compound represented by the following general formula (6)

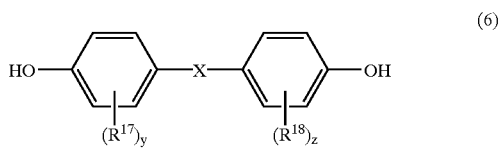

wherein, X represents an oxygen atom or a sulphur atom. $R^{17}$ and $R^{18}$ each represent a hydrogen atom or a $C_{1-10}$ monovalent organic group, and they may both be the same, and y and z represent integers in the range 0 to 4.

4. A positive photosensitive resin precursor composition according to claim 2 where the phenol compound of dipole moment 0.1 to 1.6 debye is a compound represented by the following general formula (7)

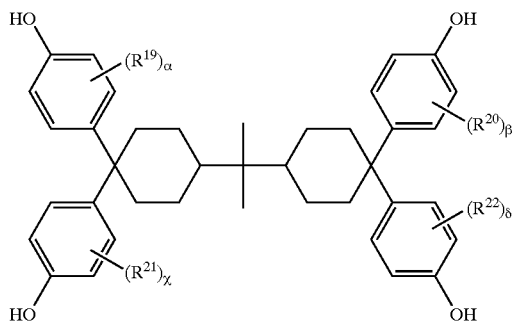

wherein, $R^{19}$ to $R^{22}$ represent hydrogen atoms or $C_{1-10}$ monovalent organic groups, $R^{19}$ to $R^{22}$ may be the same, and α, β, χ and δ represent integers in the range 0 to 4.

5. A positive photosensitive resin precursor composition according to claim 1 which satisfies condition (b).

6. A positive photosensitive resin precursor composition according to claim 5 which contains a phenol compound represented by general formula (8) and a naphthoquinone diazide sulphonic acid.

7. A positive photosensitive resin precursor composition according to claim 5 which contains the ester of a naphthoquinone diazide sulphonic acid with a phenol compound represented by general formula (8).

8. A positive photosensitive resin precursor composition according to claim 7 which contains, as the ester of a naphthoquinone diazide sulphonic acid with a phenol compound represented by general formula (8), a naphthoquinone diazide sulphonic acid ester represented by general formula (9)

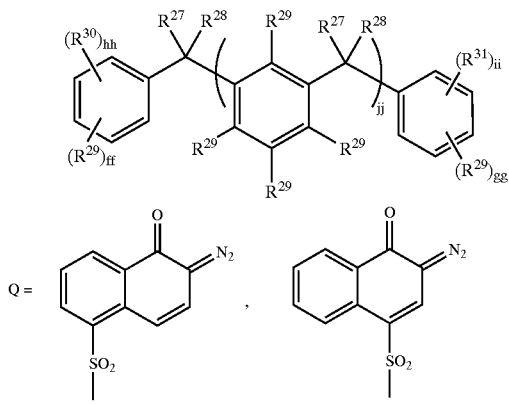

wherein, $R^{27}$, $R^{28}$, $R^{30}$ and $R^{31}$ each represent a hydrogen atom, or a $C_{1-8}$ alkyl group, alkoxy group, carboxyl group or ester group, at least one $R^{29}$ denotes —OQ, and the rest represent hydroxyl groups, hydrogen atoms or $C_{1-8}$ alkyl groups, a and b represent integers in the range 0 to 3, Q represents the 5-naphthoquinone diazide sulphonyl group or the 4-naphthoquinone diazide sulphonyl group, and all Q are not hydrogen atoms.

9. A positive photosensitive resin precursor composition according to claim 1 which is characterized in that $R^1$ $(COOR^3)_m(OH)_p$ of general formula (1) is represented by general formula (2)

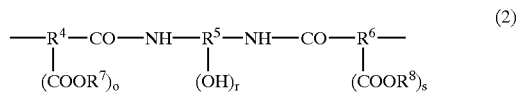

wherein, $R^4$ and $R^6$ represent $C_{2-20}$ trivalent or tetravalent organic groups, $R^5$ represents a hydroxyl group-containing $C_{3-20}$ trivalent to hexavalent organic group, $R^7$ and $R^8$ represent hydrogen and/or a $C_{1-20}$ organic group, s represents an integer in the range 1 to 2, o represents an integer in the range 0 to 2, and r represents an integer in the range 1 to 4.

10. A positive photosensitive resin precursor composition according to claim 1 where $R^2(OH)_q$ of general formula (1) is represented by the following general formula (3)

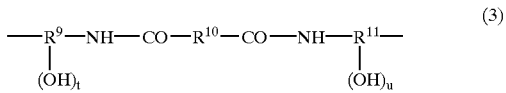

wherein, $R^9$ and $R^{11}$ represent $C_{2-20}$ trivalent or tetravalent organic groups, $R^{10}$ represents a hydroxyl group-containing $C_{3-20}$ bivalent organic group, and t and u represent the integers 1 or 2.

11. A positive photosensitive resin precursor composition according to claim 1 where $R^2(OH)_q$ of general formula (1) is represented by the following general formula (4)

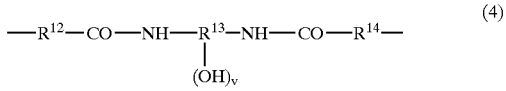

wherein, $R^{12}$ and $R^{14}$ represent $C_{2-30}$ bivalent organic groups, $R^{13}$ represents a hydroxyl group-containing $C_{2-20}$ trivalent to hexavalent organic group and v represents an integer in the range 1 to 4.

12. A photosensitive resin precursor composition according to claim 1 where $R^2(OH)_q$ of general formula (1) is represented by the following general formula (5)

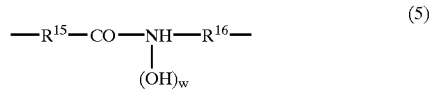

wherein, $R^{15}$ represents a $C_{2-30}$ bivalent organic group, $R^{16}$ represents a hydroxyl group-containing $C_{2-20}$ trivalent to hexavalent organic group; and w represents an integer in the range 1 to 4.

* * * * *